(12) United States Patent
Hill

(10) Patent No.: US 7,099,014 B2
(45) Date of Patent: Aug. 29, 2006

(54) APPARATUS AND METHOD FOR JOINT MEASUREMENT OF FIELDS OF SCATTERED/REFLECTED OR TRANSMITTED ORTHOGONALLY POLARIZED BEAMS BY AN OBJECT IN INTERFEROMETRY

(75) Inventor: Henry Allen Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 301 days.

(21) Appl. No.: 10/816,180

(22) Filed: Apr. 1, 2004

(65) Prior Publication Data

US 2004/0227951 A1 Nov. 18, 2004

Related U.S. Application Data

(60) Provisional application No. 60/459,425, filed on Apr. 1, 2003.

(51) Int. Cl.
*G01B 9/02* (2006.01)
(52) U.S. Cl. .................. 356/450; 356/484; 356/491
(58) Field of Classification Search ................ 356/450, 356/484, 485, 486, 487, 488, 491, 492, 493, 356/494, 498, 499, 502, 521
See application file for complete search history.

(56) References Cited

U.S. PATENT DOCUMENTS

| 3,628,027 A | 12/1971 | Brauss |
| 3,748,015 A | 7/1973 | Offner |
| 4,011,011 A | 3/1977 | Hemstreet et al. |
| 4,226,501 A | 10/1980 | Shafer |
| 4,272,684 A | 6/1981 | Seachman |
| 4,685,803 A | 8/1987 | Sommargren |
| 4,733,967 A | 3/1988 | Sommargren |
| 5,220,403 A | 6/1993 | Batchelder |
| 5,241,423 A | 8/1993 | Chiu et al. |
| 5,327,223 A | 7/1994 | Korth |
| 5,485,317 A | 1/1996 | Perissinotto |
| 5,602,643 A | 2/1997 | Barrett |
| 5,614,763 A | 3/1997 | Womack |
| 5,633,972 A | 5/1997 | Walt |
| 5,659,420 A | 8/1997 | Wakai |
| 5,699,201 A | 12/1997 | Lee |

(Continued)

OTHER PUBLICATIONS

U.S. Appl. No. 09/852,369, filed Jan. 3, 2002, Hill.

(Continued)

*Primary Examiner*—Gregory J. Toatley, Jr.
*Assistant Examiner*—Michael A. Lyons
(74) *Attorney, Agent, or Firm*—Wilmer Cutler Pickering Hale and Dorr LLP

(57) ABSTRACT

A method of making interferometric measurements of an object, the method including: generating an input beam that includes a plurality of component beams, each of which is at a different frequency and all of which are spatially coextensive with each other, some of the components beams having a first polarization and the rest having a second polarization that is orthogonal to the first polarization; deriving a plurality of measurement beams from the plurality of component beams, each of the plurality of measurement beams being at the frequency of the component beam from which it is derived; focusing the plurality of measurement beams onto a selected spot to produce a plurality of return measurement beams; combining each of the return measurement beams of the plurality of return measurement beams with a different corresponding reference beam of a plurality of reference beams to produce a plurality of interference beams; and acquiring a plurality of electrical interference signal values for the selected spot from the plurality of interference beams.

20 Claims, 6 Drawing Sheets

U.S. PATENT DOCUMENTS

| | | |
|---|---|---|
| 5,760,901 A | 6/1998 | Hill |
| 5,828,455 A | 10/1998 | Smith |
| 5,894,195 A | 4/1999 | McDermott |
| 5,915,048 A | 6/1999 | Hill et al. |
| 6,052,231 A | 4/2000 | Rosenbluth |
| 6,091,496 A | 7/2000 | Hill |
| 6,124,931 A | 9/2000 | Hill |
| 6,219,144 B1 | 4/2001 | Hill et al. |
| 6,271,923 B1 | 8/2001 | Hill |
| 6,330,065 B1 | 12/2001 | Hill |
| 6,407,816 B1 | 6/2002 | De Groot et al. |
| 6,445,453 B1 | 9/2002 | Hill |
| 6,447,122 B1 | 9/2002 | Kobayashi et al. |
| 6,480,285 B1 | 11/2002 | Hill |
| 6,552,805 B1 | 4/2003 | Hill |
| 6,552,852 B1 | 4/2003 | Hill |
| 6,597,721 B1 | 7/2003 | Hutchinson et al. |
| 6,606,159 B1 | 8/2003 | Hill |
| 6,667,809 B1 | 12/2003 | Hill |
| 6,714,349 B1 | 3/2004 | Nam |
| 6,717,736 B1 | 4/2004 | Hill |
| 6,753,968 B1 | 6/2004 | Hill |
| 6,775,009 B1 | 8/2004 | Hill |
| 6,847,029 B1 | 1/2005 | Hill |
| 6,847,452 B1 | 1/2005 | Hill |
| 6,972,846 B1 * | 12/2005 | Lal et al. .................... 356/486 |
| 2002/0074493 A1 | 6/2002 | Hill |
| 2003/0174992 A1 | 9/2003 | Levene |
| 2004/0246486 A1 | 9/2004 | Hill |
| 2004/0201852 A1 | 10/2004 | Hill |
| 2004/0201853 A1 | 10/2004 | Hill |
| 2004/0201854 A1 | 10/2004 | Hill |
| 2004/0201855 A1 | 10/2004 | Hill |
| 2004/0202426 A1 | 10/2004 | Hill |
| 2004/0227950 A1 | 11/2004 | Hill |
| 2004/0227951 A1 | 11/2004 | Hill |
| 2004/0228008 A1 | 11/2004 | Hill |
| 2004/0257577 A1 | 12/2004 | Hill |

OTHER PUBLICATIONS

U.S. Appl. No. 09/917,402, filed Jul. 27, 2001, Hill.
U.S. Appl. No. 10/765,368, filed Jan. 27, 2004, Hill.
U.S. Appl. No. 60/442,858, filed Jul. 27, 2002, Hill.
U.S. Appl. No. 60/442,982, filed Jan. 29, 2003, Hill.
U.S. Appl. No. 60/444,707, filed Jan. 4, 2003, Hill.
U.S. Appl. No. 60/445,739, filed Feb. 7, 2003, Hill.
U.S. Appl. No. 60/447,254, filed Feb. 13, 2003, Hill.
U.S. Appl. No. 60/459,425, filed Apr. 11, 2003, Hill.
U.S. Appl. No. 60/460,129, filed Apr. 3, 2003, Hill.
Silfvast, W. (1995) "Lasers", *Handbook of Optics*, New York:: McGraw-Hill, Ch. 11.
Stoicheff, et al. "Tunable, Coherent Sources for High Resolution VUV and XUV Spectroscopy", *Laser Techniques for Extreme Ultraviolet Spectroscopy*, p. 19 (1982).
Harris, et al. "Generation Ultraviolet and Vacuum Ultraviolet Radiation" *Laser Spectroscopy*.
Kung, A.H., "Generation of Tunable Picosecond VUV Radiation" *Appl. Phys Lett*. 25, p. 653 (1974).
D'ariano, et al. "Lower Bounds on Phase Sensitivity in Ideal and Feasible Measurements" *Phys. Rev. A* 49, pp. 3022-3036 (1994).

* cited by examiner

US 7,099,014 B2

APPARATUS AND METHOD FOR JOINT MEASUREMENT OF FIELDS OF SCATTERED/REFLECTED OR TRANSMITTED ORTHOGONALLY POLARIZED BEAMS BY AN OBJECT IN INTERFEROMETRY

This application also claims the benefit of U.S. Provisional Application No. 60/459,425, filed Apr. 1, 2003.

TECHNICAL FIELD

This invention relates to the interferometric measurement of orthogonally polarized beams

BACKGROUND OF THE INVENTION

There are various ways of practicing non-ellipsometric interferometric confocal far-field and near-field microscopy. Some of those known ways involve using heterodyne techniques and a detector having a single detector element or having a relatively small number of detector elements. Others involve using a step and stare method with a traditional homodyne detection method for the acquisition of conjugated quadratures of fields of reflected/scattered beams when a detector is used that comprises a large number of detector elements. $x(\phi)$ a $\cos \phi$. The respective conjugated quadrature of the field is a $\sin \phi$ when the quadrature $x(\phi)$ of a field is expressed as |a|cos $\phi$. The step and stare method and the traditional homodyne detection method are used in order to obtain for each detector element a set of at least four electrical interference signal values with a substrate that is stationary with respect to the respective interferometric microscope during the stare portion of the step and stare method. The set of at least four electrical interference signal values are required to obtain for each detector element conjugated quadratures of fields of a measurement beam comprising a reflected and/or scattered far-field or near-field from a spot in or on a substrate that is conjugate to the each detector element.

Still other ways of practicing interferometric ellipsometry involve using either a homodyne detection method or heterodyne techniques and a detector having a single detector element or having a relatively small number of detector elements.

It is also known to use a double homodyne detection method for non-ellipsometric applications based on using four detectors wherein each detector generates an electrical interference signal value used to determine a corresponding component of a conjugated quadratures of a field. See, for example, the discussion found in Section IV of the article by G. M D'ariano and M G. A. Paris entitled "Lower Bounds On Phase Sensitivity In Ideal And Feasible Measurements," Phys. Rev. A 49, 3022–3036 (1994). In that case, the four detectors generate four electrical interference signal values simultaneously and each electrical interference signal value contains information relevant to one conjugated quadratures component.

SUMMARY OF THE INVENTION

Various embodiments presented herein relate to making high spatial resolution confocal and non-confocal interferometric ellipsometric measurements. Some of the embodiments involve making joint measurements of fields of scattered/reflected or transmitted orthogonally polarized beams when operating in either a relatively fast scanning mode or a step and stare mode. Other embodiments involve making joint measurements of fields of scattered/reflected or transmitted orthogonally polarized beams wherein the joint measurements of the fields comprise joint measurements of conjugated quadratures of each of the fields when also operating in either a relatively fast scanning mode or a step and stare mode.

According to one particular embodiment, at least eight electrical interference signal values (four electrical interference signal values for each of two orthogonally polarized beams) are acquired with interferometric ellipsometric confocal and non-confocal microscopy that is operating in a relatively fast scanning mode and each of the at least eight electrical interference signal values correspond to the same respective spot on or in the substrate and contain information that can be used for determining joint measurements in both spatial and temporal coordinates of conjugated quadratures of fields of scattered/reflected or transmitted orthogonally polarized beams.

Also, in accordance with the ideas presented herein, joint measurements are made of conjugated quadratures of fields of orthogonally polarized beams reflected from a measurement object in linear and angular displacement interferometers.

In addition, another implementation of the invention in the area of scanning high spatial resolution interferometric ellipsometric confocal and non-confocal microscopy uses variants of the bi- and quad-homodyne detection methods to obtain joint measurements of conjugated quadratures of fields of orthogonally polarized beams reflected/scattered or transmitted by a substrate with a detector having a large number of detector elements. For each spot in and/or on the substrate that is imaged, a corresponding set of eight electrical interference signal values is obtained. Each of the sets of eight electrical interference signal values contains information for determination of a joint measurement of respective conjugated quadratures of fields. Similarly, in the area of linear and angular displacement interferometry, joint measurements are made of conjugated quadratures of fields of orthogonally polarized beams reflected from a measurement object.

Still another implementation of the invention involves using the double homodyne detection method to make joint determinations of conjugated quadratures of fields wherein each electrical interference value contains information simultaneously about each of two orthogonal components of the conjugated quadratures in non-ellipsometric applications.

One variant of the bi-homodyne detection methods described herein obtains eight electrical interference signal values wherein each measured value of an electrical interference signal contains simultaneously information about two orthogonal components of a conjugated quadratures for each of two orthogonally polarized beams scattered/reflected or transmitted by an object. According to that variant of the bi-homodyne detection method, a single detector element is used for each electrical interference signal value obtained and the input beam to the interferometer system includes at least four frequency components with frequency differences large compared to the frequency bandwidth of the detector for a joint measurement of each of the two conjugated quadratures. Two frequency components are used to generate electrical interference signal components corresponding to conjugated quadratures of a field of a measurement beam comprising a reflected/scattered or transmitted far-field or near-field from a spot in or on a measurement object that is conjugate to a detector element.

The two other frequency components are used to generate two other electrical interference signal components corresponding to a respective second conjugated quadratures of the field of an orthogonally polarized component of the measurement beam reflected/scattered or transmitted from a spot in or on the measurement object that is conjugate to the detector element. Information about each of the first and second conjugated quadratures are obtained jointly as a consequence of the four frequency components being coextensive in space and having the same temporal window function in the interferometer system. The temporal window function when operating in a scanning mode corresponds to the window function of a respective set of pulses of the input beam to the interferometer system.

A variant of the quad-homodyne detection method is also discussed which uses two detectors and an input beam to an interferometer system that includes eight coextensive measurement beams and corresponding reference beams in the interferometer system simultaneously to obtain information about two orthogonal components of a conjugated quadratures for fields of two orthogonally polarized beams scattered/reflected or transmitted by an object. One detector element is used to obtain four electrical interference signal values and the second detector element is used to obtain four other of the eight electrical interference signal values.

The eight coextensive measurement beams and corresponding reference beams are generated in the interferometer system simultaneously by using an input beam that comprises eight frequency components wherein each frequency component corresponds to a measurement and corresponding reference beam. The frequency differences of the eight frequency components are such that the eight frequency components are resolved by an analyzer into two non-overlapping beams. The two beams are incident on two different detector elements wherein each of the two beams comprises four different frequency components and the frequency differences of the four different frequency components of each of the two beams are large compared to the frequency bandwidth of the detectors. Each of the four frequency components incident on a first detector element of the two detector elements is used to generate an electrical interference signal component corresponding to a component of conjugated quadratures of fields of two orthogonal measurement beam components either reflected/scattered or transmitted in either the far-field or near-field regime from a spot in or on a measurement object that is conjugate to the detector element. The description for the second detector element with respect to four respective frequency components and components of conjugated quadratures is the same as the corresponding description with respect to the first detector element. Information about the components of the conjugated quadratures of scattered/reflected or transmitted orthogonally polarized fields are accordingly obtained jointly as a consequence of the eight frequency components being coextensive in space and having the same temporal window function in the interferometer system. The temporal window function when operating in a scanning mode corresponds to the window function of a respective set of four pulses of the input beam to the interferometer system.

Other variants of the quad-homodyne detection method are described wherein information about the components of the conjugated quadratures of fields of scattered/reflected or transmitted orthogonally polarized fields are obtained with either two pulses or in a single pulse of the input beam.

When operating in the scanning mode and using the variants of the bi- and quad-homodyne detection methods, conjugate sets of detector elements are defined and used. A conjugate set of detector elements comprise the pixels of the detector conjugate to the spot on or in the substrate at the times that the measurements are made of a corresponding set of electrical interference signal values.

For each of the frequency components of the input beam, reference and measurement beams are generated. In certain of the embodiments different phase shift combinations are introduced between the respective reference and measurement beam components by shifting the frequencies of one or more of the frequency components of the input beam for acquiring a set of eight electrical interference signal values for each spot in or on the measurement object that is imaged. In other embodiments, different phase shift combinations are introduced between the respective reference and measurement beam components by shifting the relative phase of reference and measurement beam components for one or more of the frequency components of the input beam.

In general, in one aspect, the invention features a method of making interferometric measurements of an object. The method involves: generating an input beam that includes a plurality of component beams, each of which is at a different frequency and all of which are spatially coextensive with each other, some of the components beams having a first polarization and the rest having a second polarization that is orthogonal to the first polarization; deriving a plurality of measurement beams from the plurality of component beams, each of the plurality of measurement beams being at the frequency of the component beam from which it is derived; focusing the plurality of measurement beams onto a selected spot to produce a plurality of return measurement beams; combining each of the return measurement beams of the plurality of return measurement beams with a different corresponding reference beam of a plurality of reference beams to produce a plurality of interference beams; and acquiring a plurality of electrical interference signal values for the selected spot from the plurality of interference beams.

Other embodiments include one or more of the following features. Acquiring the plurality of electrical interference signal values involves, for each of the plurality of acquired electrical signal values, introducing a different combination of phase shifts between the return measurement and reference beams that produce each of the interference beams of said plurality of interference beams. Each of the plurality of electrical interference signal values contains information simultaneously about both fields of two orthogonally polarized beams coming from the selected spot. Each of the plurality of electrical interference signal values contains information simultaneously about both conjugated quadratures of each field of the two orthogonally polarized beams scattered, reflected or transmitted by the object at the selected spot. The detector element includes a detector having a sensitivity that is characterized by a frequency bandwidth and the method further involves using frequencies for the plurality of component beams that separated from each other by at least an amount that is greater than the frequency bandwidth of the detector. The plurality of component beams includes an equal number of beams at each of said first and second polarizations. The plurality of component beams includes two beams having the first polarization and two beams having the second polarization. Alternatively, the plurality of component beams includes four beams having the first polarization and four beams having the second polarization. Introducing a different combination of phase shifts between the return measurement and reference beams that produce each of the interference beams of the plurality of interference beams involves introducing various frequency shifts into the frequencies of the beams of the plurality of component beams. Combining involves generating a plurality of interference beams that are coextensive in space and the method further involves focusing the plurality of interference beams onto a single detector element. Acquiring the plurality of electrical interference signal values from the plurality of interference beams involves acquiring eight electrical interference signal values. The method also includes from the plurality of acquired electrical interference signal values computing information about fields of orthogonally polarized beams that are scattered, reflected, or transmitted by the object at the selected spot.

In general, in another aspect, the invention features an interferometry system for making interferometric measurements of an object. The system includes: a beam generation module which during operation delivers an output beam that includes a first set of beams having a first polarization and a second set of beams having a second polarization that is orthogonal to the first polarization, wherein all of the beams of the first and second sets of beams are at a different frequency and within the output beam are coextensive in space, the beam generation module including a beam conditioner which during operation introduces a sequence of different shifts in a selected parameter of each of the beams of the first and second sets of beams, the selected parameter selected from a group consisting of phase and frequency; a detector assembly; and an interferometer constructed to produce from the output beam a first set of measurement beams having the first polarization and a second set of measurement beams having the second polarization, said interferometer further constructed to image both the first and second sets of measurement beams onto a selected spot on the object to produce therefrom corresponding first and second sets of return measurement beams, and to combine the first and second sets of return measurement beams with a plurality of corresponding reference beams to produce a first and second set of interference beams and simultaneously image the first and second sets of interference beams onto the detector assembly.

Other embodiments include one or more of the following features. The measurement beams of the first and second sets of measurement beams are coextensive in space and share the same temporal window function. The beam conditioner by introducing the sequence of different shifts in the selected parameter of each of the beams introduces a different combination of phase shifts between the return measurement and reference beams that produce each of the interference beams of the plurality of interference beams. The detector assembly includes a detector element onto which the first and second sets of interference beams are simultaneously focused to generate an electrical interference signal value, wherein the electrical interference signal value contains information simultaneously about both fields of two orthogonally polarized beams coming from the selected spot. The electrical interference signal value contains information simultaneously about both conjugated quadratures of each field of the two orthogonally polarized beams scattered, reflected or transmitted by the object at the selected spot. The detector assembly includes a detector having a sensitivity that is characterized by a frequency bandwidth and wherein the frequencies of the beams of the first and second set of beams are separated from each other by at least an amount that is greater than the frequency bandwidth of the detector. The first and second sets of beams each includes two beams. Alternatively, the first and second sets of beams each includes four beams.

One advantage of at least one embodiment is that a one-dimensional, two-dimensional or three-dimensional image of a substrate may be obtained in interferometric confocal and non-confocal far-field and near-field microscopy when operating in a scanning mode with a relatively fast scan rate. The image comprises a one-dimensional array, a two-dimensional array or a three-dimensional array of conjugated quadratures of fields of orthogonally polarized beams reflected/scattered or transmitted field by an object.

Another advantage of at least one embodiment is that information used in the determination of conjugated quadratures of fields of orthogonally polarized beams reflected/scattered or transmitted fields by a substrate are obtained jointly, i.e., simultaneously.

Another advantage of at least one embodiment is that the conjugated quadratures of fields that are obtained jointly when operating in the scanning mode and using the variants of the bi- and quad-homodyne detection methods have reduced sensitivity to effects of pinhole-to-pinhole variations in properties of a conjugate set of pinholes used in a confocal microscopy system that are conjugate to a spot in or on the substrate being imaged at different times during the scan.

Another advantage of at least one embodiment is that the conjugated quadratures of fields that are obtained jointly when operating in the scanning mode and using the variants of the bi- and quad-homodyne detection methods have reduced sensitivity to effects of pixel-to-pixel variation of properties within a set of conjugate pixels that are conjugate to a spot in or on the substrate being imaged at different times during the scan.

Another advantage of at least one embodiment is that the conjugated quadratures of fields that are obtained jointly when operating in the scanning mode and using the variants of the bi- and quad-homodyne detection methods have reduced sensitivity to effects of pulse to pulse variations of a respective set of pulses of the input beam to the interferometer system.

Another advantage of at least one embodiment is an increased through-put for an interferometric far-field or near-field confocal or non-confocal microscope with respect to the number of spots in and/or on a substrate imaged per unit time using orthogonally polarized measurement beams.

Another advantage of at least one embodiment is reduced systematic errors in a one-dimensional, a two-dimensional or a three-dimensional image of a substrate obtained in interferometric far-field and near-field confocal and non-confocal microscopy using orthogonally polarized measurement beams.

Another advantage of at least one embodiment is reduced sensitivity to vibrations in generating one-dimensional, two-dimensional or three-dimensional images of a substrate by interferometric far-field and near-field confocal and non-confocal microscopy using orthogonally polarized measurement beams.

Another advantage of at least one embodiment is reduced sensitivity to an overlay error of a spot in or on the substrate that is being imaged and a conjugate image of a conjugate pixel of a multipixel detector during the acquisition of eight electrical interference values of each spot in and/or on a substrate imaged using interferometric far-field and/or near-field confocal and non-confocal microscopy and orthogonally polarized measurement beams. Overlay errors are errors in the set of conjugate images of a respective set of conjugate detector pixels relative to the spot being imaged.

Another advantage of at least one embodiment is that in certain embodiments the phase of an input beam component does not affect values of respective measured conjugated quadratures as a result of using the variants of the bi- and quad-homodyne detection methods.

DETAILED DESCRIPTION

Figure 1A:
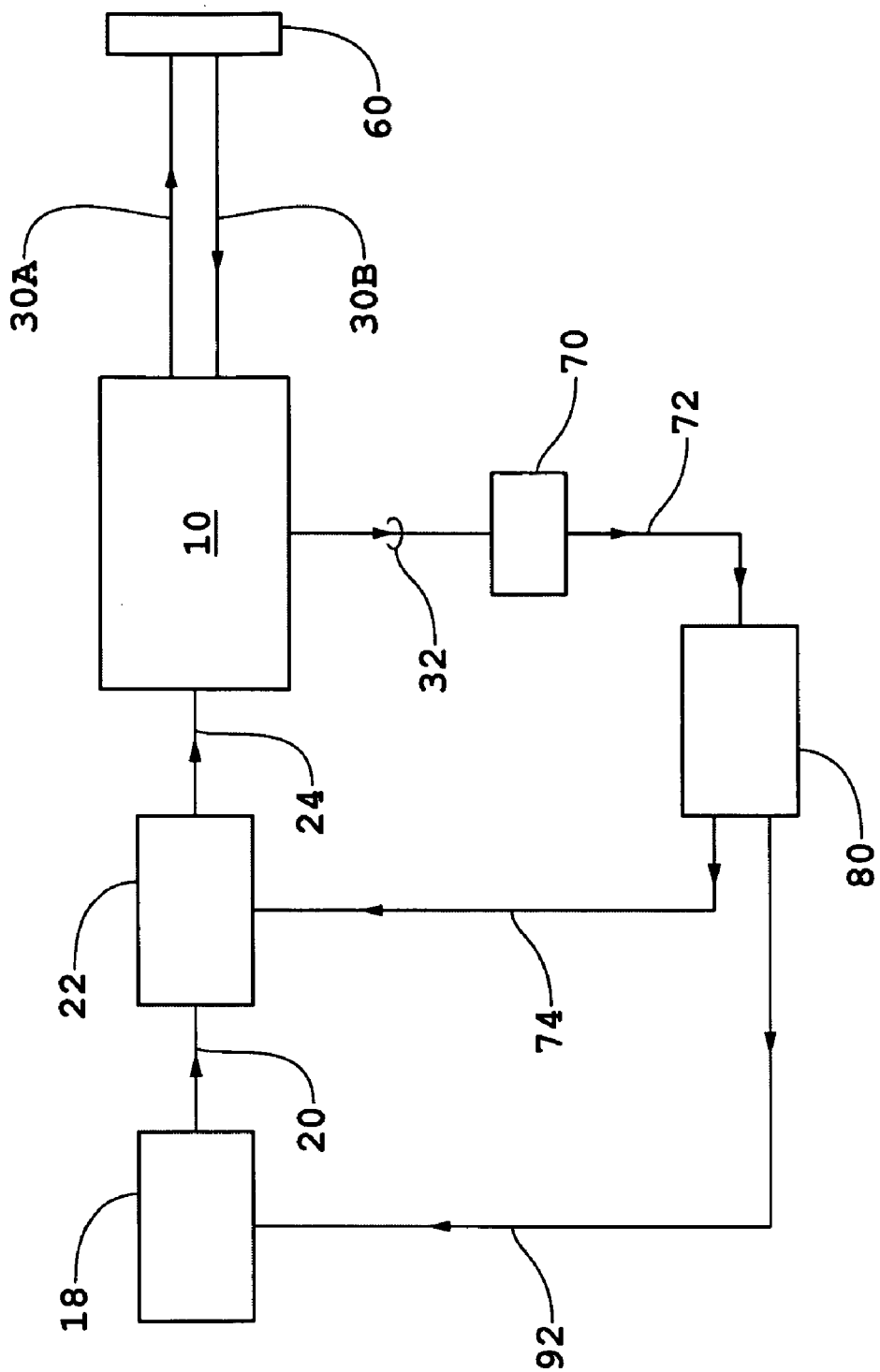
FIG. 1a is a diagram of an interferometric system that uses the bi-homodyne and quad-homodyne detection methods.

High speed, high spatial resolution imaging with high signal-to-noise ratios is required for example in inspection of masks and wafers in microlithography. Two techniques for obtaining high spatial resolution imaging with orthogonally polarized measurement beams and high signal-to-noise ratios are interferometric far-field and near-field confocal microscopy. However, the high signal-to-noise ratios with the high spatial resolution imaging generally limits data rates in part by the necessity to acquire conjugated quadratures of fields of a reflected/scattered or transmitted beam for each spot in and/on a substrate being imaged. The determination of conjugated quadratures when using a measurement beam comprising orthogonally polarized components requires the measurement of at least eight electrical interference signal values for the each spots in and/or on the substrate being imaged. Acquisition of the at least eight interference signal values for the each spots places tight restrictions on how large a rate of scan can be employed in generation of a one-dimensional, a two-dimensional or three-dimensional image of the substrate having artifacts down to of the order of 30 nm in size.

The use of variants of the bi- and quad-homodyne detection methods relaxes the tight restriction and permits significantly increased through-put in high spatial resolution ellipsometric imaging that has high signal-to-noise ratios for each spot being imaged. The tight restriction is relaxed as a consequence of a joint measurement of conjugated quadratures of fields of orthogonally polarized measurement beams scattered/reflected or transmitted by an object using a conjugate set of at least eight pinholes and a conjugate set of at least eight pixels for each spot being imaged wherein the temporal window function for the measured at least eight electrical interference signal values used in the determination of one component of conjugated quadratures of the fields is the same as the temporal window function measured at least eight interference signal values used in the determination of each of the other three components of the conjugated quadratures of the fields. For the variant of the bi-homodyne detection method, the temporal window functions are made the same by using a different frequency component of an input beam for the determination of each component of the conjugated quadratures of the fields of orthogonally polarized measurement beams scattered/reflected or transmitted by an object. For the variant of the quad-homodyne detection method, the temporal window functions are made the same by using two different frequency components of an input beam for the determination of each component of the conjugated quadratures of the fields of orthogonally polarized measurement beams scattered/reflected or transmitted by an object. The set of four frequency components and the set of eight frequency components of the input beam for the bi- and quad-homodyne detection methods, respectively, are coextensive in spatial and temporal coordinates, i.e., coextensive in space and have the same temporal window functions.

Several embodiments are described that comprise interferometric confocal and non-confocal far-field ellipsometric microscopy systems, interferometric confocal and non-confocal near-field microscopy systems, and linear displacement interferometers, e.g., such as used in wavelength monitors, refractivity of gas monitors, monitors of the reciprocal dispersive power $\Gamma$ of a gas, and dispersion interferometry. A general description of embodiments will first be given for interferometer systems wherein the variants of the bi- and quad-homodyne detection methods are used in interferometer systems for making joint measurements of conjugated quadratures of fields of orthogonally polarized beams beams scattered/reflected and or transmitted by a measurement object. Referring to FIG. 1a, an interferometer system is shown diagrammatically comprising an interferometer 10, a source 18, a beam-conditioner 22, detector 70, an electronic processor and controller 80, and a measurement object 60. Source 18 is a pulsed or shuttered source that generates input beam 20 comprising one or more frequency components. Beam 20 is incident on and exits beam-conditioner 22 as input beam 24 that comprises two orthogonally polarized components. Each of the orthogonally polarized components comprises two or more different frequency components. The measurement beam components of the frequency components of input beam 24 are coextensive in space and have the same temporal window function and the corresponding reference beam components are coextensive in space and have the same temporal window function.

Reference and measurement beams may be generated in either beam-conditioner 22 from a set of beams or in interferometer 10 for each of the two or four frequency components of input beam 24. Measurement beam 30A generated in either beam-conditioner 22 or in interferometer 10 is incident on substrate 60. Measurement beam 30B is a return measurement beam generated as either a portion of measurement beam 30A reflected and/or scattered by substrate 60 or a portion of measurement beam 30A transmitted by substrate 60. Return measurement beam 30B is combined with the reference beam in interferometer 10 to form output beam 32.

Output beam 32 is detected by detector 70 to generate either one or more electrical interference signals per source pulse for the variants of the bi-homodyne or quad-homodyne detection methods, respectively and transmitted as signal 72. Detector 70 may comprise an analyzer to select common polarization states of the reference and return measurement beam components of beam 32 to form a mixed beam. Alternatively, interferometer 10 may comprise an analyzer to select common polarization states of the reference and return measurement beam components such that beam 32 is a mixed beam.

In practice, known phase shifts are introduced between the reference and measurement beam components of output beam 32 by two different techniques. In the first technique, phase shifts are introduced between corresponding reference and measurement beam components for each of the frequency components of output beam 32 as a consequence of a non-zero optical path difference between the reference and measurement beam paths in interferometer 10 and corresponding frequency shifts introduced to the frequency components of input beam 24 by beam-conditioner 22 and/or source 18 as controlled by signal 74 from electronic processor and controller 80. In the second technique, phase shifts are introduced between the reference and measurement beam components for each of the frequency components of input beam 24 by beam-conditioner 22 as controlled by signal 74 from electronic processor and controller 80.

Figure 1B:
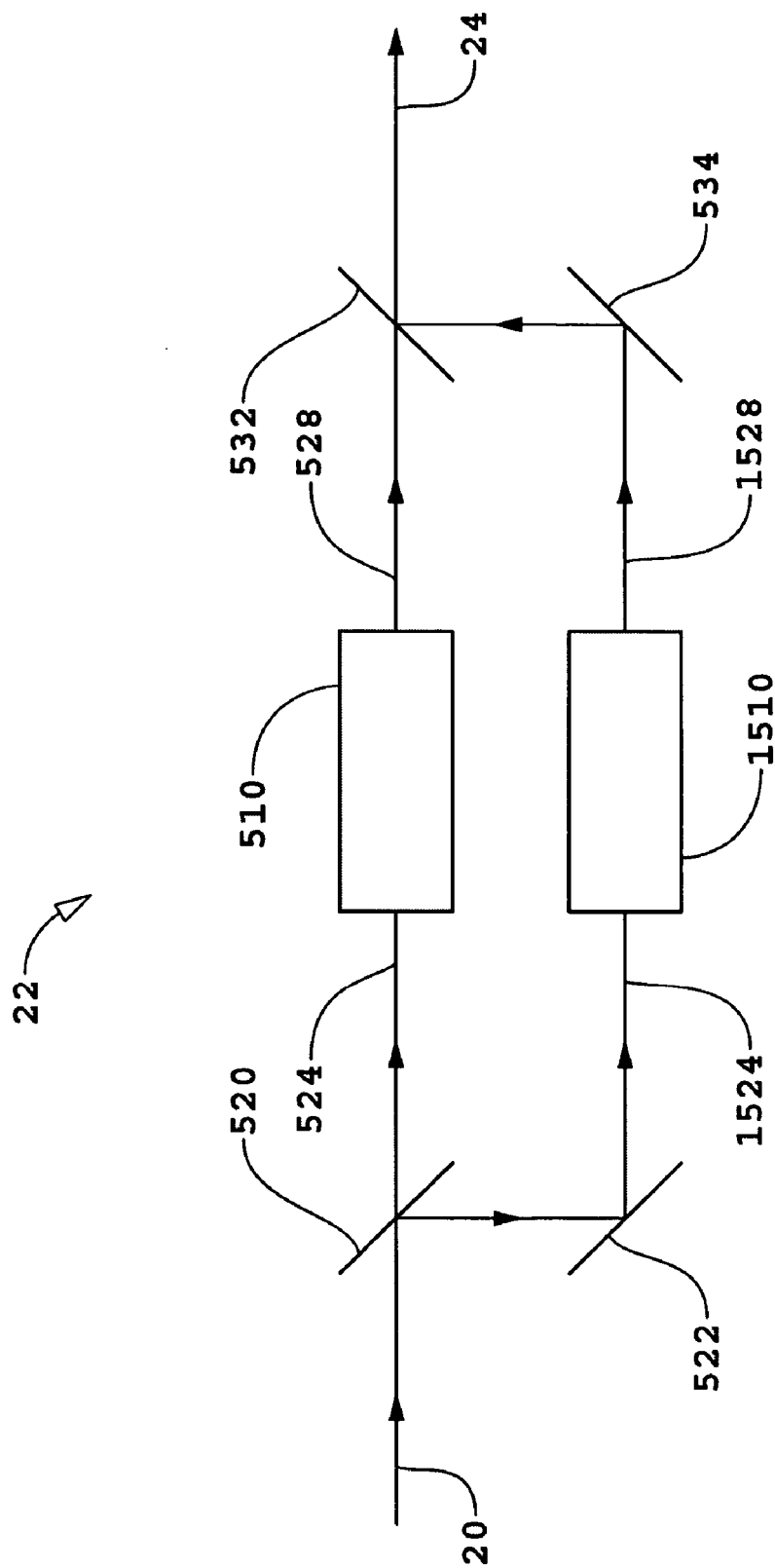
FIG. 1b is a schematic diagram of a beam-conditioner configured to operate as a four-frequency generator.

There are different ways to configure source 18 and beam-conditioner 22 to meet the input beam requirements of different embodiments. Reference is made to FIG. 1b where a first embodiment of beam-conditioner 22 is shown schematically for the introduction of frequency shifts. Beam-conditioner 22 comprises two other beam-conditioners 510 and 1510, polarizing beam-splitters 520 and 532, and mirrors 522 and 534. Input beam 20 comprises two orthogonally polarized frequency components that have planes of polarization parallel to and orthogonal to the plane of FIG. 1b. The two frequency components of input beam 20 may be generated for example in source 18 as two different orthogonally polarized longitudinal excited modes of a laser. Input beam 20 is incident on polarizing beam-splitter 520 and a first portion thereof is transmitted as beam 524. A second portion of input beam 20 that is incident polarizing beam-splitter 520 is reflected to form beam 1524 after reflection by mirror 522. The frequencies of orthogonally polarized beams 524 and 1524 correspond to the two different frequencies of beam 24. The plane of polarization of beam 524 is parallel to the plane of FIG. 1b and the plane of polarization of beam 1524 is orthogonal to the plane of FIG. 1b.

Beams 524 and 1524 are incident on beam-conditioners 510 and 1510, respectively, and exit as beams 528 and 1528, respectively. The planes of polarization of beams 528 and 1528 are parallel and orthogonal to the plane of FIG. 1b, respectively. Beams 528 and 1528 each comprise two different frequency components and the two frequency components of beam 528 are different from the two frequency components of beam 1528. The frequencies of beam 528 and 1528 are controlled by signal 74.

Beams 528 and 1528 are subsequently combined to form beam 24 by polarizing beam-splitter 532 and mirror 534. Beam 24 comprises two different frequency components with a plane of polarization parallel to the plane of FIG. 1b and two other different frequency components with a plane of polarization that is orthogonal to the plane of FIG. 1b. The frequencies of each of the four different frequency components are individually controlled by signal 74.

Figure 1C:
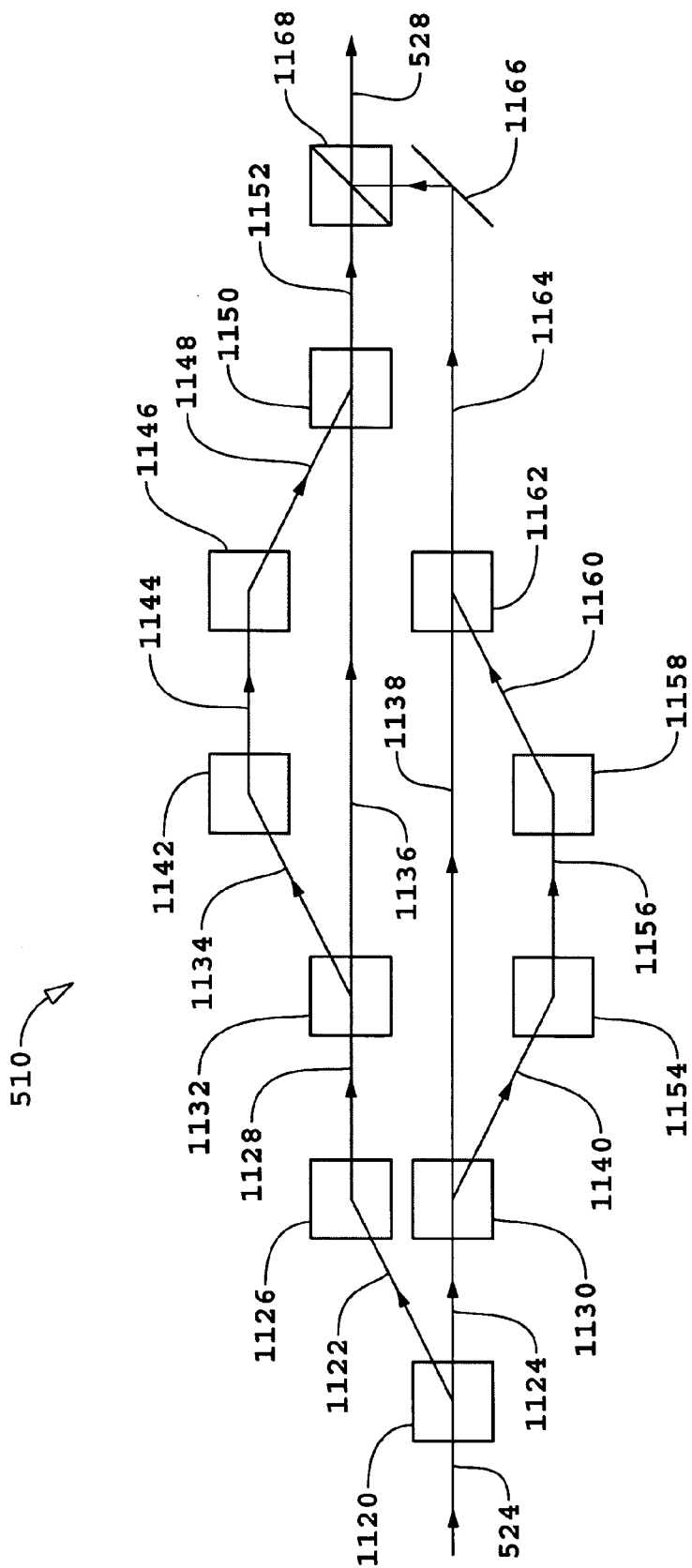
FIG. 1c is a schematic diagram of a section of a beam-conditioner configured to operate as a two-frequency generator.

Reference is made to FIG. 1c where beam-conditioner 510 is shown schematically. Signal 74 comprises a first signal component for the control of the frequencies of beam-conditioner 510 and a second signal component for the control of the frequencies of beam-conditioner 1510. Beam-conditioner 510 is configured to receive an input beam with a plane of polarization parallel to the plane of FIG. 1c and beam-conditioner 1510 is configured to receive an input beam with a plane of polarization orthogonal to the plane of FIG. 1c. The planes of polarization of the output beams of beam-conditioners 510 and 1510 are the same as the planes of polarization of the respective input beams.

Beam-conditioner 510 comprises acousto-optic modulators 1120, 1126, 1130, 1132, 1142, 1146, 1150, 1154, 1058, and 1062; beam-splitter 1168; and mirror 1166. Input beam 524 is incident on acousto-optic modulator 1120 with a plane of polarization parallel to the plane of FIG. 1c. A first portion of beam 524 is diffracted by acousto-optic modulator 1120 as beam 1122 and then by acousto-optic modulator 1126 as beam 1128 having a polarization parallel to the plane of FIG. 1c. A second portion of beam 524 is transmitted as a non-diffracted beam 1124 having a plane of polarization parallel to the plane of FIG. 1c. The acoustic power to acousto-optic modulator 1120 is adjusted such that beams 1122 and 1124 have nominally the same intensity.

Acousto-optic modulators 1120 and 1126 may be of either the non-isotropic Bragg diffraction type or of the isotropic Bragg diffraction type. The frequency shifts introduced by acousto-optic modulators 1120 and 1126 are of the same sign and equal to ½ of a frequency shift $\Delta f_1$, that will generate in interferometer 10 a $\pi/2$ mod $2\pi$ phase difference between a reference and a measurement beams that have a difference in frequency equal to the frequency shift. The direction of propagation of beam 1128 is parallel to the direction of propagation of beam 1124.

Continuing with FIG. 1c, beam 1128 is incident on acousto-optic modulator 1132 and is either diffracted by acousto-optic modulator 1132 as beam 1134 or transmitted by acousto-optic modulator 1132 as beam 1136 according to control signal 74 from electronic processor and controller 80. When beam 1134 is generated, beam 1134 is diffracted by acousto-optic modulators 1142, 1146, and 1150 as a frequency-shifted beam component of beam 1152. The frequency shifts introduced by acousto-optic modulators 1132, 1142, 1146, and 1150 are all in the same direction and equal in magnitude to $\Delta f_2/2$ where frequency shift $\Delta f_2$ will generate in interferometer 10 a $\pi/2$ mod $\pi$ phase difference between a reference and a measurement beams that have a difference in frequency equal to the frequency shift $\Delta f_2$. Thus the net frequency shift introduced by acousto-optic modulators 1132, 1142, 1146, and 1150 is $\pm 2\Delta f_2$ and will generate a relative $\pi$ phase mod $2\pi$ between the respective reference and measurement beams in interferometer 10. The net frequency shift introduced by acousto-optic modulators 1120, 1126, 1132, 1142, 1146, and 1150 is $\Delta f_1 \pm 2\Delta f_2$ and will generate a respective relative phase shift of $\pi/2 \pm \pi$ mod $2\pi$ between the respective reference and measurement beams in interferometer 10. Frequency shifts $\Delta f_1$ and $\Delta f_2$ may be equal in magnitude.

When beam 1136 is generated, beam 1136 is transmitted by acousto-optic modulator 1150 as a non-frequency shifted beam component of beam 1152 with respect to beam 1128. The frequency shift introduced by acousto-optic modulators 1120, 1126, 1132, and 1150 is $\Delta f_1$ and will generate a respective relative phase shift of $\pi/2$ mod $2\pi$ between the respective reference and measurement beams in interferometer 10. The planes of polarization of the two different frequency-shifted components of beam 1152 are parallel to the plane of FIG. 1c.

Beam 1124 is incident on acousto-optic modulator 1130 and is either diffracted by acousto-optic modulator 1130 as beam 1140 or transmitted by acousto-optic modulator 1130 as beam 1138 according to control signal 74 from electronic processor and controller 80. When beam 1140 is generated, beam 1140 is diffracted by acousto-optic modulators 1154, 1158, and 1162 as a frequency shifted beam component of beam 1164. The frequency shifts introduced by acousto-optic modulators 1130, 1154, 1158, and 1162 are all in the same direction and equal to $\pm \Delta f_3/2$ where frequency shift $\Delta f_3$ will generate in interferometer 10 a $\pi/2$ mod $\pi$ phase difference between a reference and a measurement beams that have a difference in frequency equal to the frequency shift $\Delta f_3$. Thus the net frequency shift introduced by acousto-optic modulators 1130, 1154, 1158, and 1162 is $\pm 2\Delta f_3$ and will generate a relative phase shift of $\pi$ mod $2\pi$ between the respective reference and measurement beams in interferometer 10. The net frequency shift introduced by acousto-optic modulators 1120, 1130, 1154, 1158, and 1162 is $\pm 2\Delta f_3$ and will generate a respective relative phase shift of $\pm \pi$ mod $2\pi$ between the respective reference and measurement beams in interferometer 10.

When beam 1138 is generated, beam 1138 is transmitted by acousto-optic modulator 1162 as a non-frequency shifted beam component of beam 1164. The frequency shift introduced by acousto-optic modulators 1120, 1130, and 1162 is 0 and will generate a respective relative phase shift of 0 between the respective reference and measurement beams in interferometer 10. The planes of polarization of the frequency-shifted and non-frequency-shifted components of beam 1164 are parallel to the plane of FIG. 1c.

Beams 1152 and 1164 are combined to form beam 528. Beam 1152 is transmitted by non-polarizing beam-splitter 1168 as a component of beam 528 that has a plane of polarization parallel to the plane of FIG. 1c. Beam 1164 is reflected by non-polarizing beam-splitter 1168 after reflection by mirror 1166 as a second component of beam 528 that has a plane of polarization parallel to the plane of FIG. 1c. Acousto-optic modulators 1120, 1126, 1130, 1132, 1142, 1146, 1150, 1154, 1058, and 1062 may be either of the non-isotropic Bragg diffraction type or of the isotropic Bragg diffraction type.

The description of beam-conditioner 1510 is the same as the corresponding portions of the description of beam-conditioner 510 except with respect to magnitudes of frequency shifts introduced by the two beam-conditioners, the control by signal 74, and to the state of polarization of respective input beams. The description of frequency shifts $\Delta f_{10}$, $\Delta f_{20}$, and $\Delta f_{30}$ introduced by beam-conditioner 1510 is the same as the corresponding description of the frequency shifts $\Delta f_1$, $\Delta f_2$, and $\Delta f_3$, respectively, introduced by beam-conditioner 510. The selection of the frequency shifts $\Delta f_1$, $\Delta f_2$, $\Delta f_3$, $\Delta f_{10}$, $\Delta f_{20}$, $\Delta f_{30}$, and the frequency difference between the two frequency components of beam 20 is made such that as noted earlier beams 528 and 1528 each comprise two different frequency components and the two frequency components of beam 528 are different from the two frequency components of beam 1528.

Examples beam-conditioners of the second technique comprise combinations of a two frequency generator and phase shifting type of beam-conditioner such as described in cited U.S. Provisional Patent Application Ser. No. 60/442,858 (ZI-47), filed Jan. 27, 2003 and in U.S. patent application Ser. No. 10/765,369, filed Jan. 27, 2004 (ZI-47), entitled "Apparatus and Method for Joint Measurements of Conjugated Quadratures of Fields of Reflected/Scattered and Transmitted Beams by an Object in Interferometry," the contents of both of which are incorporated herein by reference. In this case, beam-conditioners 510 and 1510 each comprise two frequency generator and phase shifting type beam-conditioner.

With a continuation of the description of different ways to configure source 18 and beam-conditioner 22 to meet the input beam requirements of different embodiments, source 18 will preferably comprise a pulsed source. There are a number of different ways for producing a pulsed source [see Chapter 11 entitled "Lasers", *Handbook of Optics*, 1, 1995 (McGraw-Hill, New York) by W. Silfvast]. Each pulse of source 18 may comprise a single pulse or a train of pulses such as generated by a mode locked Q-switched Nd:YAG laser. A single pulse train is referenced herein as a pulse. The word "pulse" and the phrase "a pulse train" are used herein interchangeably.

Source 18 may be configured in certain embodiments to generate two or more frequencies by techniques such as described in a review article entitled "Tunable, Coherent Sources For High-Resolution VUV and XUV Spectroscopy" by B. P. Stoicheff, J. R. Banic, P. Herman, W. Jamroz, P. E. LaRocque, and R. H. Lipson in *Laser Techniques for Extreme Ultraviolet Spectroscopy*, T. J. McIlrath and R. R. Freeman, Eds., (American Institute of Physics) p 19 (1982) and references therein. The techniques include for example second and third harmonic generation and parametric generation such as described in the articles entitled "Generation of Ultraviolet and Vacuum Ultraviolet Radiation" by S. E. Harris, J. F. Young, A. H. Kung, D. M. Bloom, and G. C. Bjorklund in *Laser Spectroscopy* I, R. G. Brewer and A. Mooradi, Eds. (Plenum Press, New York) p 59, (1974) and "Generation of Tunable Picosecond VUV Radiation" by A. H. Kung, *Appl. Phys. Lett.* 25, p 653 (1974). The contents of the three cited articles are herein incorporated in their entirety by reference.

The output beams from source 18 comprising two or more frequency components may be combined in beam-conditioner 22 by beam-splitters to form coextensive measurement and reference beams that are either spatially separated or coextensive as required in various embodiments. When source 18 is configured to furnish two or more frequency components, the frequency shifting of the various components required in certain embodiments may be introduced in source 18 for example by frequency modulation of input beams to parametric generators and the phase shifting of reference beams relative to measurement beams in beam-conditioner 22 may be achieved by phase shifters of the optical-mechanical type comprising for example prisms or mirrors and piezoelectric translators or of the electro-optical modulator type.

The general description is continued with reference to FIG. 1a. Input beam 24 is incident on interferometer 10 wherein reference beams and measurement beams are generated. The reference beams and measurement beams comprise two arrays of reference beams and two arrays of measurement beams wherein the arrays may comprise arrays of one element. The arrays of measurement beams are focused on and/or in substrate 60 and arrays of return measurement beams are generated by reflection/scattering by the substrate. In the case of single element arrays for the reference beams and measurement beams, the measurement beams are generally reflected by substrate 60. The arrays of reference beams and return measurement beams are combined by a beam splitter to form two arrays of output beams. The arrays of output beams are mixed with respect to state of polarization either in interferometer 10 or in detector 70. The arrays of output beams are subsequently focused to spots on pixels of a multipixel detector and detected to generate electrical interference signal 72.

The conjugated quadratures of fields of return measurement beams are obtained by using a variant of the bi- or quad-homodyne detection methods such as described in commonly owned U.S. Provisional Patent Application Ser. No. 60/442,858 (ZI-47) entitled "Apparatus and Method for Joint Measurements of Conjugated Quadratures of Fields of Reflected/Scattered Beams by an Object in Interferometry" and in U.S. patent application Ser. No. 10/765,369, filed Jan. 27, 2004 (ZI-47) and entitled "Apparatus and Method for Joint Measurements of Conjugated Quadratures of Fields of Reflected/Scattered and Transmitted Beams by an Object in Interferometry" both of which are by Henry A. Hill. The contents of both the cited U.S. Provisional Patent Application and the U.S. Patent Application are incorporated herein in their entirety by reference.

Referring to the variant of the bi-homodyne detection method used in some embodiments, a set of eight electrical interference signal values are obtained for each spot on and/or in substrate 60 being imaged. The set of eight electrical interference signal values $S_j$, $j=1,2, \ldots, 8$ used for obtaining conjugated quadratures of fields for a single a spot on and/or in a substrate being imaged is represented for the bi-homodyne detection within a scale factor by the formula $$S_j = P_j \sum_{m=1}^{4} \begin{Bmatrix} \xi_j^2 |A_m|^2 + \zeta_j^2 |B_m|^2 + \eta_j^2 |C_m|^2 + \\ \zeta_j \eta_j 2 |B_m||C_m| \cos\varphi_{B_m C_m} \varepsilon_{m,j} + \\ \xi_j \zeta_j 2 |A_m||B_m| \cos\varphi_{A_m B_m} \varepsilon_{m,j} + \\ \varepsilon_{m,j} \xi_j \eta_j [1 - (-1)^m] |A_m||C_m| \cos\varphi_{A_m C_m} + \\ \varepsilon_{m,j} \xi_j \eta_j [1 + (-1)^m] |A_m||C_m| \sin\varphi_{A_m C_m} \end{Bmatrix} \quad (1)$$

where coefficient $A_m$ represents the amplitude of the reference beam corresponding to the frequency component of the input beam 24 that has the index m; coefficient $B_m$ represent the amplitude of the background beam corresponding to reference beam $A_m$; coefficient $C_m$ represents the amplitude of the return measurement beam corresponding to reference beam $A_m$; $P_j$ represents the integrated intensity of the first frequency component of input beam 24 pulse j of a sequence of 8 pulses; and an example set of values for $\varepsilon_{m,j}$ are listed in Table 1. There are other sets of values for $\varepsilon_{m,j}$ that may be used wherein the other sets of values for $\varepsilon_{m,j}$ satisfy the conditions set out in subsequent Equations (2) and (3) herein.

The change in the values of $\varepsilon_{m,j}$ from 1 to −1 or from −1 to 1 corresponds to changes in relative phases of respective reference and measurement beams. The coefficients $\xi_j$, $\zeta_j$, and $\eta_j$ represent effects of variations in properties of a conjugate set of eight pinholes such as size and shape if used in the generation of the spot on and/or in substrate 60 and the sensitivities of a conjugate set of eight detector pixels corresponding to the spot on and/or in substrate 60 for the reference beam, the background beam, and the return measurement beam, respectively.

The relationships $\cos \varphi_{A_2 C_2} = \sin \varphi_{A_1 C_1}$ and $\cos \varphi_{A_4 C_4} = \sin \varphi_{A_3 C_3}$ have been used in deriving Equation (1) without departing from either the scope or spirit of the present invention since $\cos \varphi_{A_2 C_2} = \pm \sin \varphi_{A_1 C_1}$ and $\cos \varphi_{A_4 C_4} = \pm \sin \varphi_{A_3 C_3}$ by control of the relative phase shifts between corresponding reference and return measurement beam components in beam 32.

It has also been assumed in Equation (1) that the ratios $|A_2|/|A_1|$ and $|A_4|/|A_3|$ are not dependent on j or on the value of $P_j$. In order to simplify the representation of $S_j$ so as to project the important features without departing from either the scope or spirit of the present invention, it is also assumed in Equation (1) that the corresponding ratios of the amplitudes of the return measurement beams are not dependent on j or on the value of $P_j$. However, the ratios $|C_2|/|C_1|$ and $|C_4|/|C_3|$ will be different from the ratio $|A_2|/|A_1|$ and $|A_4|/|A_3|$, respectively, when the ratios of the amplitudes of the measurement beam components corresponding to $A_2$ and $A_1$ are different from the ratio $|A_2|/|A_1|$ and corresponding to $A_4$ and $A_3$ are different from the ratio $|A_4|/|A_3|$.

TABLE 1

| | $\varepsilon_{m,j}$ | | | |
|---|---|---|---|---|
| | m | | | |
| j | 1 | 2 | 3 | 4 |
| 1 | 1 | 1 | −1 | 1 |
| 2 | 1 | −1 | 1 | −1 |
| 3 | −1 | −1 | 1 | 1 |
| 4 | −1 | 1 | −1 | −1 |
| 5 | 1 | 1 | 1 | 1 |
| 6 | 1 | −1 | −1 | −1 |
| 7 | −1 | −1 | −1 | 1 |
| 8 | −1 | 1 | 1 | −1 |

The change in phase $\phi_{A_m B_m \varepsilon_{m,j}}$ for a change in $\varepsilon_{m,j}$ may be different from π for embodiments where phase shifts are introduced between the arrays of reference and measurement beams by changing the frequency of an input beam component. It may be of value in evaluating the effects of the background beams to note that the factor $\cos \phi_{B_m C_m \varepsilon_{m,j}}$ may be written as $\cos [\phi_{A_m C_m} + (\phi_{B_m C_m \varepsilon_{m,j}} - \phi_{A_m C_m})]$ where the phase difference $(\phi_{B_m C_m \varepsilon_{m,j}} - \phi_{A_m C_m})$ is the same as the measured phase $\phi_{A_m B_m \varepsilon_{m,j}}$.

It is evident from inspection of Equation (1) that the components of conjugated quadratures $\varepsilon_{m,j} |C_m| \cos \phi_{A_m C_m}$ and $\varepsilon_{m,j} |C_m| \sin \phi_{A_m C_m}$ in Equation (1) are functions that have mean values of zero since $$\sum_{j=1}^{8} \varepsilon_{m,j} = 0, \, m = 1, 2, 3, 4. \quad (2)$$

Another important property is that the conjugated quadratures $\varepsilon_{m,j} |C_m| \cos \phi_{A_m C_m}$ and $\varepsilon_{m',j} |C_m| \sin \phi_{A_m C_m}$ are orthogonal over the range of m=1,2,3,4 for m≠m' since $\varepsilon_{m,j}$ and $\varepsilon_{m',j}$ are orthogonal over the range of j=1,2, ..., 8, i.e., $$\sum_{j=1}^{8} \varepsilon_{m,j} \varepsilon_{m',j} = 8 \delta_{m,m'} \quad (3)$$

where $\delta_{m,m'}$ is the Kronecker delta defined by $\delta_{m,m'}=1$ for m=m', $\delta_{m,m'}=0$ for m≠m'. (4)

Information about conjugated quadratures $|C_m| \cos \phi_{A_m C_m}$ and $|C_m| \sin \phi_{A_m C_m}$ are obtained using a digital filter $F_m (S_j)$ on signals $S_j$ that are based on the orthogonality properties of the $\varepsilon_{m,j}$ as represented by (3). The definition of $F_m (S_j)$ and the output of digital filter $F_m(S_j)$ are $$F_m(S_j) = \sum_{j=1}^{8} \varepsilon_{m,j} \frac{S_j}{P_j' \xi_j'^2} = \quad (5)$$

$$\sum_{m'=1}^{4} |A_{m'}|^2 \sum_{j=1}^{8} \varepsilon_{m,j} \left(\frac{P_j}{P_j'}\right)\left(\frac{\xi_j^2}{\xi_j'^2}\right) + \sum_{m'=1}^{4} |B_{m'}|^2 \sum_{j=1}^{8} \varepsilon_{m,j} \left(\frac{P_j}{P_j'}\right)\left(\frac{\zeta_j^2}{\xi_j'^2}\right) +$$

-continued $$\sum_{m'=1}^{4} |C_{m'}|^2 \sum_{j=1}^{8} \varepsilon_{m,j} \left(\frac{P_j}{P'_j}\right)\left(\frac{\eta_j^2}{\xi_j'^2}\right) + [1-(-1)^m]|A_m||C_m|$$

$$\cos\varphi_{A_m C_m} \sum_{j=1}^{8} \left(\frac{P_j}{P'_j}\right)\left(\frac{\xi_j \eta_j}{\xi_j'^2}\right) \sum_{m'=1}^{4} \varepsilon_{m,j}\varepsilon_{m',j} + [1+(-1)^m]$$

$$|A_m||C_m|\sin\varphi_{A_m C_m} \sum_{j=1}^{8} \left(\frac{P_j}{P'_j}\right)\left(\frac{\xi_j \eta_j}{\xi_j'^2}\right) \sum_{m'=1}^{4} \varepsilon_{m,j}\varepsilon_{m',j} +$$

$$2\sum_{m'=1}^{4} |A_{m'}||B_{m'}| \sum_{j=1}^{8} \varepsilon_{m,j}\left(\frac{P_j}{P'_j}\right)\left(\frac{\xi_j \zeta_j}{\xi_j'^2}\right) \cos\varphi_{A_{m'}B_{m'}\varepsilon_{m',j}} +$$

$$2\sum_{m'=1}^{4} |B_{m'}||C_{m'}| \sum_{j=1}^{8} \varepsilon_{m,j}\left(\frac{P_j}{P'_j}\right)\left(\frac{\zeta_j \eta_j}{\xi_j'^2}\right) \cos\varphi_{B_{m'}C_{m'}\varepsilon_{m',j}}.$$

where $\xi'_j$ and $P'_j$ are values used in the digital filter to represent $\xi_j$ and $P_j$, respectively.

The parameters $$\left[\left(\frac{|A_2|}{|A_1|}\right)\left(\frac{|C_2|}{|C_1|}\right)\right], \tag{6}$$

$$\left[\left(\frac{|A_4|}{|A_3|}\right)\left(\frac{|C_4|}{|C_3|}\right)\right] \tag{7}$$

need to be determined in order complete the determination of a conjugated quadratures. The parameters given in Equations (6) and (7) can be measured for example by introducing π/2 phase shifts into the relative phase of the reference beam and the measurement beam and repeating the measurement for the conjugated quadratures. The ratios of the amplitudes of the conjugated quadratures corresponding to (sin $\phi_{A_1C_1}$/cos $\phi_{A_1C_1}$) and (sin $\phi_{A_3C_3}$/cos $\phi_{A_3C_3}$) from the first measurement divided by the ratios of the amplitudes of the conjugated quadratures corresponding to (sin $\phi_{A_1C_1}$/cos $\phi_{A_1C_1}$) and (sin $\phi_{A_3C_3}$/cos $\phi_{A_3C_3}$), respectively, from the second measurement are equal to $$\left[\left(\frac{|A_2|}{|A_1|}\right)\left(\frac{|C_2|}{|C_1|}\right)\right]^2, \tag{8}$$

$$\left[\left(\frac{|A_4|}{|A_3|}\right)\left(\frac{|C_4|}{|C_3|}\right)\right]^2, \tag{9}$$

respectively.

Note that certain of the factors in Equation (5) have nominal values of 8 within a scale factor, e.g., $$\sum_{j=1}^{8} \left(\frac{P_j}{P'_j}\right)\left(\frac{\xi_j \eta_j}{\xi_j'^2}\right) \sum_{m'=1}^{4} \varepsilon_{m,j}\varepsilon'_{m,j} \cong \sum_{j=1}^{8} \left(\frac{P_j}{P'_j}\right)\left(\frac{\xi_j \eta_j}{\xi_j'^2}\right) \delta_{m,m'} \cong 8\delta_{m,m'} \tag{10}$$

where $\delta_{m,m'}$ is the Kronecker delta defined by Equation (4). The scale factors corresponds to the average value for the ratio of $(\xi'_j)^2/(\xi_j \eta_j)$ assuming that the average values of $P_j/P'_j \cong 1$.

Certain other of the factors in Equations (5) have nominal values of zero, e.g., $$\sum_{j=1}^{8} \varepsilon_{m,j}\left(\frac{P_j}{P'_j}\right)\left(\frac{\xi_j^2}{\xi_j'^2}\right) \cong 0, \quad \sum_{j=1}^{8} \varepsilon_{m,j}\left(\frac{P_j}{P'_j}\right)\left(\frac{\zeta_j^2}{\xi_j'^2}\right) \cong 0, \tag{11}$$

$$\sum_{j=1}^{8} \varepsilon_{m,j}\left(\frac{P_j}{P'_j}\right)\left(\frac{\eta_j^2}{\xi_j'^2}\right) \cong 0.$$

The remaining factors, $$\sum_{j=1}^{8} \varepsilon_{m,j}\left(\frac{P_j}{P'_j}\right)\left(\frac{\xi_j \zeta_j}{\xi_j'^2}\right) \cos\varphi_{A_{m'}B_{m'}\varepsilon_{m',j}}, \tag{12}$$

$$\sum_{j=1}^{8} \varepsilon_{m,j}\left(\frac{P_j}{P'_j}\right)\left(\frac{\zeta_j \eta_j}{\xi_j'^2}\right) \cos\varphi_{B_{m'}C_{m'}\varepsilon_{m',j}}$$

will have nominal magnitudes ranging from of approximately zero to approximately 8 times a cosine factor and either the average value of factor $(P_j/P'_j)(\xi_j\zeta_j/\xi_j'^2)$ or $(P_j/P'_j)(\zeta_j\eta_j/\xi_j'^2)$ depending on the properties respective phases. For portion of the background with phases that do not track to a first approximation the phases of the respective measurement beams, the magnitudes of all of the terms listed in the Equation (12) will be approximately zero. For the portion of the background with phases that do track to a first approximation the phases of the respective measurement beams, the magnitudes of the terms listed in Equation (12) will be approximately 8 times a cosine factor and either the average value of factor $(P_j/P'_j)(\xi_j\zeta_j/\xi_j'^2)$ or factor $(P_j/P'_j)(\zeta_j\eta_j/\xi_j'^2)$.

The two potentially largest terms in Equations (5) are generally the terms that have the factors $$\sum_{m'=1}^{4} |A_{m'}|^2 \text{ and } \sum_{m'=1}^{4} |B_{m'}|^2.$$

However, the corresponding terms are substantially eliminated in embodiments using the bi-homodyne detection method as result of the properties of the factors listed in Equation (11).

The largest contribution from effects of background is represented by the contribution to the interference term between the reference beam and the portion of the background beam generated by the measurement beam 30A. This portion of the effect of the background can be measured in embodiments of the bi-homodyne detection method by measuring the corresponding conjugated quadratures of the portion of the background with the return measurement beam component of beam 32 set equal to zero, i.e., measuring the respective electrical interference signals $S_j$ with substrate 60 removed and with either $|A_2|$=0 or $|A_1|$=0 and visa versa and with either $|A_4|=0$ or $|A_3|=0$ and visa versa. The measured conjugated quadratures of the portion of the effect of the background can than be used to compensate for the respective background effects beneficially in an end use application if required.

Information about the largest contribution from effects of background amplitude $\xi_j\zeta_j 2A_m B_m$ and phase $\phi_{A_m B_m \epsilon_{mj}}$, i.e., the interference term between the reference beam and the portion of background beam generated by the measurement beam 30A, may be obtained by measuring $S_j$ for $j=1,2,\ldots,8$ as a function of relative phase shift between reference beam and the measurement beam 30A with substrate 60 removed and $A_p=0$, $p \neq m$, and Fourier analyzing the measured values of $S_j$. Such information can be used to help identify the origin of the respective background.

Other techniques may be incorporated to reduce and/or compensate for the effects of background beams without departing from either the scope or spirit of the present invention such as described in commonly owned U.S. Pat. No. 5,760,901 entitled "Method And Apparatus For Confocal Interference Microscopy With Background Amplitude Reduction and Compensation," U.S. Pat. No. 5,915,048 entitled "Method and Apparatus for Discrimination In-Focus Images from Out-of-Focus Light Signals from Background and Foreground Light Sources," and U.S. Pat. No. 6,480,285 B1 wherein each of the three patents are by Henry A. Hill. The contents of each of the three cited patents are incorporated herein in their entirety by reference.

The selection of values for $\xi'_j$ is based on information about coefficients $\xi_j$ for $j=1,2,\ldots,8$ that may be obtained by measuring the $S_j$ for $j=1,2,\ldots,8$ with only the reference beam present in the interferometer system. In certain embodiments, this may correspond simply blocking the measurement beam components of input beam 24 and in certain other embodiments, this may correspond to simply measuring the $S_j$ for $j=1,2,\ldots,8$ with substrate 60 removed. A test of the correctness of a set of values for $\xi'_j$ is the degree to which the $$\sum_{m'=1}^{4} |A_{m'}|^2$$

term in Equation (5) is zero.

Information about coefficients $\xi_j\eta_j$ for $j=1,2,\ldots,8$ may be obtained for example by scanning an artifact past the respective eight conjugate spots corresponding to the respective eight conjugate detector pixels with one of the $A_p \neq 0$ and the remaining $A_p=0$ for $p=1,2,3,4$ and measuring the conjugated quadratures component $2|A_p||C_p|\cos\phi_{A_pC_p}$ or $2|A_p||C_p|\sin\phi_{A_pC_p}$, respectively. A change in the amplitude of the $2|A_p||C_p|\cos\phi_{A_pC_p}$ or $2|A_p||C_p|\sin\phi_{A_pC_p}$ term corresponds to a variation in $\xi_j\eta_j$ as a function of j. Information about the coefficients $\xi_j\eta_j$ for $j=1,2,\ldots,8$ may be used for example to monitor the stability of one or more elements of interferometer system 10.

The variant of the bi-homodyne detection method is a robust technique for the determination of conjugated quadratures of fields. First, the conjugated quadratures $|C_m|\cos\phi_{A_mC_m}$ and $|C_m|\sin\phi_{A_mC_m}$ for each of the orthogonally polarized beams are the primary terms in the digitally filtered values $F_m(S)$ as expressed by Equations (5) since as noted in the discussion with respect to Equation (11), the terms with the factors $$\sum_{m'=1}^{4} |A_{m'}|^2 \text{ and } \sum_{m'=1}^{4} |B_{m'}|^2$$

are substantially zero.

Secondly, the coefficients of $|C_m|\cos\phi_{A_mC_m}$ and $|C_m|\sin\phi_{A_mC_m}$ terms in Equations (5) are identical. Thus highly accurate measurements of the interference terms between the return measurement beam and the reference beam with respect to amplitudes and phases, i.e., highly accurate measurements of conjugated quadratures of fields can be measured wherein first order variations in $\xi_j$ and first order errors in normalizations such as $(P_j/P'_j)$ and $(\xi_j^2/\xi'^2_j)$ enter in only second or higher order. This property translates into a significant advantage. Also, the contributions to each component of the conjugated quadratures $|C_m|\cos\phi_{A_mC_m}$ and $|C_m|\sin\phi_{A_mC_m}$ for each of the orthogonally polarized beams from a respective set of eight electrical interference signal values have the same window function and thus are obtained as jointly determined values.

Other distinguishing features of the variant of the bi-homodyne technique are evident in Equations (5): the coefficients of the conjugated quadratures $|C_m|\cos\phi_{A_mC_m}$ and $|C_m|\sin\phi_{A_mC_m}$ for each of the orthogonally polarized beams in respective equations of Equations (5) are identical independent of errors in assumed values for $\xi_j$ and $\eta_j$; and the coefficients of reference intensity terms $|A_m|^2$ can be made to be substantially zero by the selection of values for $\xi'_j$. Thus highly accurate values of the phases corresponding to conjugated quadratures can be measured with first order variations in $\xi_j$ and first order errors in normalizations such as $(P_j/P'_j)$ and $(\xi_j^2/\xi'^2_j)$ entering in only through some high order effect.

It is also evident that since the conjugated quadratures of fields of orthogonally polarized beams are obtained jointly when using the variant of the bi-homodyne detection method, there is a significant reduction in the potential for an error in tracking phase as a result of a phase redundancy unlike the situation possible in traditional homodyne detection of conjugated quadratures of fields.

There are a number of advantages of the variant of the bi-homodyne detection method as a consequence of the conjugated quadratures of fields of orthogonally polarized beams being jointly acquired quantities. One advantage is a reduced sensitivity the effects of an overlay error of a spot in or on the substrate that is being imaged and a conjugate image of conjugate pixel of a multipixel detector during the acquisition of eight electrical interference signal values of each spot in and/or on a substrate imaged using interferometric far-field and/or near-field confocal or non-confocal microscopy. Overlay errors are errors in the set of four conjugate images of a respective set of conjugate detector pixels relative to the spot being imaged.

Another advantage is that when operating in the scanning mode there is a reduced sensitivity to effects of pinhole-to-pinhole variations in properties of a conjugate set of pinholes used in a confocal microscopy system that are conjugate to a spot in or on the substrate being imaged at different times during the scan.

Another advantage is that when operating in the scanning mode there is a reduced sensitivity to effects of pixel-to-pixel variation of properties within a set of conjugate pixels that are conjugate to a spot in or on the substrate being imaged at different times during the scan.

Another advantage is that when operating in the scanning mode there is reduced sensitivity to effects of pulse to pulse variations of a respective conjugate set of pulses of input beam 24 to the interferometer system.

The pinholes and pixels of a multipixel detector of a set of conjugate pinholes and conjugate pixels of a multipixel detector may comprise contiguous pinholes of an array of pinholes and/or contiguous pixels of a multipixel detector or may comprise selected pinholes from an array of pinholes and pixels from an array of pixels wherein the separation between the selected pinholes is an integer number of pinhole spacings and the separation between an array of respective pixels corresponds to an integer number of pixel spacings without loss of lateral and/or longitudinal resolution and signal-to-noise ratios. The corresponding scan rate would be equal to the integer times the spacing of spots on the measurement object 60 conjugate to set of conjugate pinholes and/or set of conjugate pixels divided by the read out rate of the multipixel detector. This property permits a significant increase in through-put for an interferometric far-field or near-field confocal or non-confocal microscope with respect to the number of spots in and/or on a substrate imaged per unit time.

Referring to a variant of the quad-homodyne detection method, a set of eight electrical interference signal values are obtained for each spot on and/or in substrate 60 being imaged with four pulse trains from source 18 and beam-conditioner 22 configured to generate input beam 24 with eight frequency components. The set of eight electrical interference signal values $S_{n,j}$, n=1,2 and j=1,2,3,4, used for obtaining conjugated quadratures of fields for a single a spot on and/or in a substrate being imaged is represented for the variant of the quad-homodyne detection method within a scale factor by the formulae $$S_{n,j} = P_{n,j} \times \qquad (13)$$

$$\sum_{m=1}^{4} \begin{pmatrix} \xi_{n,j}^2 |A_{n,m}|^2 + \zeta_{n,j}^2 |B_{n,m}|^2 + \eta_{n,j}^2 |C_{n,m}|^2 + \\ \xi_{n,j}\zeta_{n,j}2|A_{n,m}||B_{n,m}|\cos\varphi_{A_{n,m}B_{n,m}\kappa_{m,j}} + \\ \zeta_{n,j}\eta_{n,j}2|B_{n,m}||C_{n,m}|\cos\varphi_{B_{n,m}C_{n,m}\kappa_{m,j}} + \\ \kappa_{n,m,j}\xi_{n,j}\eta_{n,j}2|A_{n,m}||C_{n,m}| \times \\ \{[1-(-1)^m]\cos\varphi_{A_{n,m}C_{n,m}} + [1+(-1)^m]\sin\varphi_{A_{n,m}C_{n,m}}\} \end{pmatrix},$$

where coefficient $A_{n,m}$ represents the amplitude of the reference beam corresponding to the frequency component of the input beam 24 that has the index (n,m); coefficient $B_{n,m}$ represent the amplitude of the background beam corresponding to reference beam $A_{n,m}$; coefficient $C_{n,m}$ represents the amplitude of the return measurement beam corresponding to reference beam $A_{n,m}$; $P_{n,j}$ represents the integrated intensity of a first frequency component of the set of frequency components corresponding to index n of input beam 24 pulse j of a sequence of 4 pulses; and an example set of values for $\kappa_{n,m,j}$ are expressed in terms of $\kappa_{m,j}$ as $$\kappa_{n,m,j} = \begin{cases} \kappa_{m,j}, & n = 1 \\ -\kappa_{m,j}, & n = 2 \end{cases} \qquad (14)$$

for the example set of values for $\kappa_{m,j}$ listed in Table 2.

TABLE 2

| | $\kappa_{m,j}$ | | | |
| | j | | | |
| m | 1 | 2 | 3 | 4 |
|---|---|---|---|---|
| 1 | 1 | 1 | 1 | 1 |
| 2 | 1 | −1 | 1 | −1 |
| 3 | 1 | 1 | −1 | −1 |
| 4 | 1 | −1 | −1 | 1 |

The $\kappa_{m,j}$ are orthogonal sets with respect to j, i.e., $$\sum_{j=1}^{4} \kappa_{m,j}\kappa_{m',j} = 4\delta_{m,m'} \qquad (15)$$

where $\delta_{m,m'}$ is the Kronecker delta defined by Equation (4).

For the variant of the quad-homodyne detection method, the interferometric signal values $S_{1,j}$ and $S_{2,j}$ are measured simultaneously by two different detector pixels for each pulse j. The distribution of the output beam 32 to two different pixels of detector 70 is achieved by a dispersion or polarizing element in interferometer system 10 such as described in cited U.S. Provisional Patent Application Ser. No. 60/442,858 (47) and U.S. patent application Ser. No. 10/765,369, filed Jan. 27, 2004 (ZI-47) and entitled "Apparatus and Method for Joint Measurements of Conjugated Quadratures of Fields of Reflected/Scattered and Transmitted Beams by an Object in Interferometry." In the remaining description, m=1,2 will correspond to one polarization state of input beam 24 and m=3,4 will correspond to the second polarization state of input beam 24 without departing from the spirit or scope of the present invention. In addition, the coefficients $A_{1,m}$, $B_{1,m}$, and $C_{1,m}$ are conjugates of the coefficients $A_{2,m}$, $B_{2,m}$, and $C_{2,m}$, respectively, for a single component of a conjugated quadrature for one of the polarization states of input beam 24.

The relationships cos $\phi_{A_{n,2}C_{n,2}} = \kappa_{2,j}$ sin $\phi_{A_{n,2}C_{n,2}}$ and cos $\phi_{A_{n,4}C_{n,4}} = \kappa_{4,j}$ sin $\phi_{A_{n,4}C_{n,4}}$ have been used in deriving Equation (13) without departing from either the scope or spirit of the present invention since cos $\phi_{A_{n,2}C_{n,2}} = \pm\sin \phi_{A_{n,1}C_{n,1}}$ and cos $\phi_{A_4C_4} = \pm\sin \phi_{A_3C_3}$ by control of the relative phase shifts between corresponding reference and return measurement beam components in beam 32.

It has also been assumed in Equation (13) that the ratios $|A_{n,2}|/|A_{n,1}|$ and $|A_{n,4}|/|A_{n,3}|$ are not dependent on j or on the value of $P_{n,j}$. In order to simplify the representation of $S_{n,j}$ so as to project the important features without departing from either the scope or spirit of the present invention, it is also assumed in Equation (13) that the corresponding ratios of the amplitudes of the return measurement beams are not dependent on j or on the value of $P_{n,j}$. However, the ratios $|C_{n,2}|/|C_{n,1}|$ and $|C_{n,4}|/|C_{n,3}|$ will be different from the ratio $|A_{n,2}|/|A_{n,1}|$ and $|A_{n,4}|/|A_{n,3}|$, respectively, when the ratios of the amplitudes of the measurement beam components corresponding to $A_{n,2}$ and $A_{n,1}$ are different from the ratio $|A_{n,2}|/|A_{n,1}|$ and corresponding to $A_{n,4}$ and $A_{n,3}$ are different from the ratio $|A_{n,4}|/|A_{n,3}|$.

The change in phase $\phi_{A_{n,m}B_{n,m}\kappa_{m,j}}$ for a change in $\kappa_{m,j}$ may be different from π for embodiments where phase shifts are introduced between the arrays of reference and measurement beams by changing the frequency of an input beam component. It may be of value in evaluating the effects of the background beams to note that the factor $\cos\phi_{B_{n,m}C_{n,m}\kappa_{m,j}}$ may be written as $\cos[\phi_{A_{n,m}C_{n,m}}+(\phi_{B_{n,m}C_{n,m}\kappa_{m,j}}-\phi_{A_{n,m}C_{n,m}})]$ where the phase difference $(\phi_{B_{n,m}C_{n,m}\kappa_{m,j}}-\phi_{A_{n,m}C_{n,m}})$ is the same as the phase $(\phi_{A_{n,m}B_{n,m}\kappa_{m,j}})$, i.e., $\cos\phi_{B_{n,m}C_{n,m}\kappa_{m,j}}=\cos(\phi_{A_{n,m}C_{n,m}}+\phi\phi_{A_{n,m}B_{n,m}\kappa_{m,j}})$.

It is evident from inspection of Equation (13) that the components of conjugated quadratures $\kappa_{m,j}|C_{n,m}|\cos\phi_{A_{n,m}C_{n,m}}$ and $\kappa_{m,j}|C_{n,m}|\sin\phi_{A_{n,m}C_{n,m}}$ are orthogonal over the range of m=1, 2,3,4 for m≠g m' since $\kappa_{m,j}$ and $\kappa_{m',j}$ are orthogonal as expressed by Equation (15).

Information about the conjugated quadratures $|C_{1,1}|\cos\phi_{A_{1,1}C_{1,1}}$ and $|C_{1,1}|\sin\phi_{A_{1,1}C_{1,1}}$ and conjugated quadratures $|C_{1,3}|\cos\phi_{A_{1,3}C_{1,3}}$ and $|C_{1,3}|\sin\phi_{A_{1,3}C_{1,3}}$ are obtained from $S_{n,j}$ using a digital filter that is based on the orthogonality properties of $\kappa_{m,j}$ expressed by Equation (15). The definition of the digital filter $F_m(S)$ is $$F_m(S) = \sum_{j=1}^{4}\sum_{n=1}^{2}\kappa_{n,m',j}\frac{S_{n,j}}{P'_{n,j}\xi'^2_{n,j}} \qquad (16)$$

where S is matrix comprising elements $S_{n,j}$ and $\xi'_{n,j}$ and $P_{n,j'}$ are values used in the digital filter to represent $\xi_{n,j}$ and $P_{n,j}$, respectively. Equation (16) is written in terms of $\kappa_{m,j}$ using the definition of $\kappa_{n,m,j}$ given by Equation (14) as $$F_{m'}(S) = \sum_{j=1}^{4}\kappa_{m',j}\left\{\frac{S_{1,j}}{P'_{1,j}\xi'^2_{1,j}} - \frac{S_{2,j}}{P'_{2,j}\xi'^2_{2,j}}\right\}. \qquad (17)$$

Using Equation (13) for expressions for $S_{n,j}$, Equation (17) is written in terms of three parts, $$F_{m'}(S)=F_{1,m'}(S)+F_{2,m'}(S)+F_{3,m'}(S) \qquad (18)$$

where $$F_{1,m'}(S) = \qquad (19)$$
$$+\sum_{j=1}^{4}\kappa_{m',j}\left\{\left(\frac{P_{1,j}}{P'_{1,j}}\right)\left(\frac{\xi^2_{1,j}}{\xi'^2_{1,j}}\right)\sum_{m=1}^{4}|A_{1,m}|^2 - \left(\frac{P_{2,j}}{P'_{2,j}}\right)\left(\frac{\xi^2_{2,j}}{\xi'^2_{2,j}}\right)\sum_{m=1}^{4}|A_{2,m}|^2\right\} +$$
$$\sum_{j=1}^{4}\kappa_{m',j}\left\{\left(\frac{P_{1,j}}{P'_{1,j}}\right)\left(\frac{\xi^2_{1,j}}{\xi'^2_{1,j}}\right)\sum_{m=1}^{4}|B_{1,m}|^2 - \left(\frac{P_{2,j}}{P'_{2,j}}\right)\left(\frac{\xi^2_{2,j}}{\xi'^2_{2,j}}\right)\sum_{m=1}^{4}|B_{2,m}|^2\right\} +$$
$$\sum_{j=1}^{4}\kappa_{m',j}\left\{\left(\frac{P_{1,j}}{P'_{1,j}}\right)\left(\frac{\eta^2_{1,j}}{\xi'^2_{1,j}}\right)\sum_{m=1}^{4}|C_{1,m}|^2 - \left(\frac{P_{2,j}}{P'_{2,j}}\right)\left(\frac{\eta^2_{2,j}}{\xi'^2_{2,j}}\right)\sum_{m=1}^{4}|C_{2,m}|^2\right\},$$

$$F_{2,m'}(S) = 2\times \qquad (20)$$
$$\left[\sum_{m=1,3}|A_{1,m}||C_{1,m}|\cos\varphi_{A_{1,m}C_{1,m}}\sum_{j=1}^{4}\left(\frac{P_{1,j}}{P'_{1,j}}\right)\left(\frac{\xi_{1,j}\eta_{1,j}}{\xi'^2_{1,j}}\right)\kappa_{m',j}\kappa_{m,j} +\right.$$
$$\left.\sum_{m=1,3}|A_{2,m}||C_{2,m}|\cos\varphi_{A_{2,m}C_{2,m}}\sum_{j=1}^{4}\left(\frac{P_{2,j}}{P'_{2,j}}\right)\left(\frac{\xi_{2,j}\eta_{2,j}}{\xi'^2_{2,j}}\right)\kappa_{m',j}\kappa_{m,j}\right] +$$

$2\times$

-continued $$\left[\sum_{m=2,4}|A_{1,m}||C_{1,m}|\sin\varphi_{A_{1,m}C_{1,m}}\sum_{j=1}^{4}\left(\frac{P_{1,j}}{P'_{1,j}}\right)\left(\frac{\xi_{1,j}\eta_{1,j}}{\xi'^2_{1,j}}\right)\kappa_{m',j}\kappa_{m,j} +\right.$$
$$\left.\sum_{m=2,4}|A_{2,m}||C_{2,m}|\sin\varphi_{A_{2,m}C_{2,m}}\sum_{j=1}^{4}\left(\frac{P_{2,j}}{P'_{2,j}}\right)\left(\frac{\xi_{2,j}\eta_{2,j}}{\xi'^2_{2,j}}\right)\kappa_{m',j}\kappa_{m,j}\right],$$

$$F_{3,m'}(S) = \times \qquad (21)$$

$$2\left[\sum_{m=1}^{4}|A_{1,m}||B_{1,m}|\cos\varphi_{A_{1,m}B_{1,m}\kappa_{m,j}}\sum_{j=1}^{4}\left(\frac{P_{1,j}}{P'_{1,j}}\right)\left(\frac{\xi_{1,j}\zeta_{1,j}}{\xi'^2_{1,j}}\right)\kappa_{m',j} - \right.$$
$$\left.\sum_{m=1}^{4}|A_{2,m}||B_{2,m}|\cos\varphi_{A_{2,m}B_{2,m}\kappa_{m,j}}\sum_{j=1}^{4}\left(\frac{P_{2,j}}{P'_{2,j}}\right)\left(\frac{\xi_{2,j}\zeta_{2,j}}{\xi'^2_{2,j}}\right)\kappa_{m',j}\right] +$$

$$2\left[\sum_{m=1}^{4}|B_{1,m}||C_{1,m}|\cos\varphi_{B_{1,m}C_{1,m}\kappa_{m,j}}\sum_{j=1}^{4}\left(\frac{P_{1,j}}{P'_{1,j}}\right)\left(\frac{\zeta_{1,j}\eta_{1,j}}{\xi'^2_{1,j}}\right)\kappa_{m',j} - \right.$$
$$\left.\sum_{m=1}^{4}|B_{2,m}||C_{2,m}|\cos\varphi_{B_{2,m}C_{2,m}\kappa_{m,j}}\sum_{j=1}^{4}\left(\frac{P_{2,j}}{P'_{2,j}}\right)\left(\frac{\zeta_{2,j}\eta_{2,j}}{\xi'^2_{2,j}}\right)\kappa_{m',j}\right].$$

In order to make the properties of the quad-homodyne detection method more easily identified, it is instructive to rewrite $F_{2,m}(S)$ given by Equation (20) as $$F_{2,m'}(S) = 2\sum_{m=1,3}|A_{1,m}||C_{1,m}|\cos\varphi_{A_{1,m}C_{1,m}} \times \qquad (22)$$

$$\left[\sum_{j=1}^{4}\left(\frac{P_{1,j}}{P'_{1,j}}\right)\left(\frac{\xi_{1,j}\eta_{1,j}}{\xi'^2_{1,j}}\right)\kappa_{m',j}\kappa_{m,j} + \right.$$
$$\left.\left[\frac{|A_{2,m}||C_{2,m}|}{|A_{1,m}||C_{1,m}|}\right]\sum_{j=1}^{4}\left(\frac{P_{2,j}}{P'_{2,j}}\right)\left(\frac{\xi_{2,j}\eta_{2,j}}{\xi'^2_{2,j}}\right)\kappa_{m',j}\kappa_{m,j}\right] +$$

$$2\sum_{m=2,4}|A_{1,m}||C_{1,m}|\sin_{A_{1,m}C_{1,m}} \times$$

$$\left[\sum_{j=1}^{4}\left(\frac{P_{1,j}}{P'_{1,j}}\right)\left(\frac{\xi_{1,j}\eta_{1,j}}{\xi'^2_{1,j}}\right)\kappa_{m',j}\kappa_{m,j} + \right.$$
$$\left.\left[\frac{|A_{2,m}||C_{2,m}|}{|A_{1,m}||C_{1,m}|}\right]\sum_{j=1}^{4}\left(\frac{P_{2,j}}{P'_{2,j}}\right)\left(\frac{\xi_{2,j}\eta_{2,j}}{\xi'^2_{2,j}}\right)\kappa_{m',j}\kappa_{m,j}\right]$$

where the relationships $\cos\phi_{A_{2,m}C_{2,m}}=\cos\phi_{A_{1,m}C_{1,m}}$ and $\sin\phi_{A_{2,m}C_{2,m}}=\sin\phi_{A_{1,m}C_{1,m}}$.

The parameters $$\left[\left(\frac{|A_{1,m+1}|}{|A_{1,m}|}\right)\left(\frac{|C_{1,m+1}|}{|C_{1,m}|}\right)\right], m=1, 2; \qquad (23)$$

$$\left[\left(\frac{|A_{2,m}|}{|A_{1,m}|}\right)\left(\frac{|C_{2,m}|}{|C_{1,m}|}\right)\right], m=1, \ldots, 4; \qquad (24)$$

need to be determined in order complete the determination of a conjugated quadratures. The first set of parameters listed in Equation (23) can be measured for example by introducing $\pi/2$ phase shifts into the relative phase of the reference beams and the measurement beams and repeating the measurement for the conjugated quadratures. The ratios of the amplitudes of the conjugated quadratures corresponding to (sin $\phi_{A_{1,m}C_{1,m}}$/cos $\phi_{A_{1,m}C_{1,m}}$) and (sin $\phi_{A_{3,m}C_{3,m}}$/cos $\phi_{A_{3,m}C_{3,m}}$) and from the first measurement divided by the ratios of the amplitudes of the conjugated quadratures corresponding to (sin $\phi_{A_{1,m}C_{1,m}}$/cos $\phi_{A_{1,m}C_{1,m}}$) and (sin $\phi_{A_{3,m}C_{3,m}}$/cos $\phi_{A_{3,m}C_{3,m}}$), respectively, from the second measurement are equal to $$\left[\left(\frac{|A_{1,m+1}|}{|A_{1,m}|}\right)\left(\frac{|C_{1,m+1}|}{|C_{1,m}|}\right)\right]^2, m = 1, 2. \quad (25)$$

The second set of parameters listed in Equation (24) can be measured by operating the quad-homodyne detection method in a bi-homodyne detection method for each of the two conjugated quadratures. To operate in a bi-homodyne detection method for one of the conjugated quadratures, the amplitudes of the frequency components of input beam 24 that do not correspond to the one of the conjugated quadratures is set equal to zero and the one of the conjugated quadratures is measured for n=1 and 2. The ratio of the amplitudes of the measured conjugated quadratures for n=1 and 2 yields information such as specified in Equation (24).

Note that certain of the factors in $F_{2,m}(S)$ given by Equation (20) have nominal values of 4 within scale factors, e.g., $$\sum_{j=1}^{4} \left(\frac{P_{1,j}}{P'_{1,j}}\right)\left(\frac{\xi_{1,j}\eta_{1,j}}{\xi'^2_{1,j}}\right)\kappa_{m',j}\kappa_{m,j} \cong 4\delta_{m',m}, \quad (26)$$

$$\sum_{j=1}^{4} \left(\frac{P_{2,j}}{P'_{2,j}}\right)\left(\frac{\xi_{2,j}\eta_{2,j}}{\xi'^2_{2,j}}\right)\kappa_{m',j}\kappa_{m,j} \cong 4\delta_{m',m},$$

where $\delta_{m,m'}$ is the Kronecker delta defined by Equation (4). The scale factors corresponds to the average values for the ratios of $(\xi'_{1,j})^2/(\xi_{1,j}\eta_{1,j})$ and $(\xi'_{2,j})^2/(\xi_{2,j}\eta_{2,j})$ assuming that the average values of $P_j/P'_j \cong 1$.

Certain other of the factors in $F_{1,m}(S)$ given by Equation (19) have nominal values of zero, e.g., $$\sum_{j=1}^{4} \kappa_{m',j}\left(\frac{P_{n,j}}{P'_{n,j}}\right)\left(\frac{\xi^2_{n,j}}{\xi'^2_{n,j}}\right) \cong 0, \quad (27)$$

$$\sum_{j=1}^{4} \kappa_{m',j}\left(\frac{P_{n,j}}{P'_{n,j}}\right)\left(\frac{\zeta^2_{n,j}}{\xi'^2_{n,j}}\right) \cong 0,$$

$$\sum_{j=1}^{4} \kappa_{m',j}\left(\frac{P_{1,j}}{P'_{1,j}}\right)\left(\frac{\eta^2_{1,j}}{\xi'^2_{1,j}}\right) \cong 0; \; n = 1, 2.$$

The remaining factors in $F_{3,m}(S)$ given by Equation (21) have nominal values of zero, e.g., $$\sum_{j=1}^{4} \left(\frac{P_{n,j}}{P'_{n,j}}\right)\left(\frac{\xi_{n,j}\zeta_{n,j}}{\xi'^2_{n,j}}\right)\kappa_{m',j} \cong 0, \quad (28)$$

$$\sum_{j=1}^{4} \left(\frac{P_{n,j}}{P'_{n,j}}\right)\left(\frac{\zeta_{n,j}\eta_{n,j}}{\xi'^2_{n,j}}\right)\kappa_{m',j} \cong 0; \; n = 1, 2.$$

The two potentially largest terms in Equations (19) are generally the terms that have the factors $$\sum_{m=1}^{4} |A_{n,m}|^2 \text{ and } \sum_{m=1}^{4} |B_{n,m}|^2, n = 1, 2.$$

However, the corresponding terms are substantially eliminated using the quad-homodyne detection method through second order effects as result of the properties of the factors listed in Equation (27).

The largest contribution from effects of background is contained in $F_{3,m}(S)$ given by Equation (21) and is represented by the contribution to the interference term between the reference beam and the portion of the background beam generated by the measurement beam 30A. This portion of the effect of the background can be measured in embodiments of the quad-homodyne detection method by measuring the corresponding conjugated quadratures of the portion of the background with the return measurement beam component of beam 32 set equal to zero, i.e., measuring the respective electrical interference signals $S_j$ with substrate 60 removed and with either $|A_{2,m}|=0$ or $|A_{1,m}|=0$ and visa versa $|A_4|=0$ $|A_3|=0$. The measured conjugated quadratures of the portion of the effect of the background can than be used to compensate for the respective background effects beneficially in an end use application if required.

Information about the largest contribution from effects of background amplitude $\xi_{n,j}\zeta_{n,j}A_{n,m}B_{n,m}$ and phase $\phi_{An,m}B_{n,m}\kappa_{m,j}$, i.e., the interference term between the reference beam and the portion of background beam generated by the measurement beam 30A, may also be obtained by measuring $S_{n,j}$ as a function of relative phase shift between reference beam and the measurement beam 30A with substrate 60 removed and $A_{n,p}=0$, $p \neq m$, and Fourier analyzing the measured values of $S_{n,j}$. Such information can be used to help identify the origin of the respective background.

Other techniques may be incorporated into embodiments of the quad-homodyne detection method to reduce and/or compensate for the effects of background beams without departing from either the scope or spirit of the present invention such as described in cited U.S. Pat. Nos. 5,760,901, 5,915,048, and 6,480,285 B1.

The selection of values for $\xi'_{n,j}$ is based on information about coefficients $\xi_{n,j}$ that may be obtained by measuring the $S_{n,j}$ for n=1,2, j=1,2,3,4 with only the reference beam present in the interferometer system. In certain embodiments, this may correspond simply blocking the measurement beam components of input beam 24 and in certain other embodiments, this may correspond to simply measuring the $S_{n,j}$ for n=1,2, j=1,2,3,4 with substrate 60 removed. A test of the correctness of a set of values for $\xi'_{n,j}$ is the degree to which the $$\sum_{m'=1}^{4} |A_{n,m'}|^2,$$

n=1,2, terms in Equation (19) are zero.

Information about coefficients $\xi_{n,j}\eta_{n,j}$ for n=1,2, j=1,2,3,4 may be obtained for example by scanning an artifact past the respective four conjugate spots corresponding to the respective eight conjugate detector pixels with one of the $A_{n,p} \neq 0$ and the remaining $A_{n,p} = 0$ for p=1,2,3,4 and measuring the conjugated quadratures component $|A_{n,p}||C_{n,p}|\cos \phi_{A_{n,p}C_{n,p}}$ or $|A_{n,p}||C_{n,p}|\sin \phi_{A_{n,p}C_{n,p}}$, respectively. A change in the amplitude of the $|A_{n,p}||C_{n,p}|\cos \phi_{A_{n,p}C_{n,p}}$ or $|A_{n,p}||C_{n,p}|\sin \phi_{A_{n,p}C_{n,p}}$ term corresponds to a variation in $\xi_{n,j}\eta_{n,j}$ as a function of n and j. Information about the coefficients $\xi_{n,j}\eta_{n,j}$ for n=1,2, j=1,2, 3,4 may be used for example to monitor the stability of one or more elements of interferometer system 10.

The variant of the quad-homodyne detection method is a robust technique for the determination of conjugated quadratures of fields. First, the conjugated quadratures $|A_{n,p}||C_{n,p}|\cos \phi_{A_{n,p}C_{n,p}}$ and $|A_{n,p}||C_{n,p}|\sin \phi_{A_{n,p}C_{n,p}}$ for each of the orthogonally polarized beams are the primary terms in the digitally filtered values $F_m(S)$ as expressed by Equation (17) since as noted in the discussion with respect to Equations (19), the terms with the factors $$\sum_{m=1}^{4} |A_{n,m}|^2 \text{ and } \sum_{m=1}^{4} |B_{n,m}|^2,$$

n=1,2, are substantially zero.

Secondly, the coefficients of $|A_{n,p}||C_{n,p}|\cos \phi_{A_{n,p}C_{n,p}}$ and $|A_{n,p}||C_{n,p}|\sin \phi_{A_{n,p}C_{n,p}}$ terms in Equations (20) are identical. Thus highly accurate measurements of the interference terms between the return measurement beam and the reference beam with respect to amplitudes and phases, i.e., highly accurate measurements of conjugated quadratures of fields can be measured wherein first order variations in $\xi_{n,j}$ and first order errors in normalizations such as $(P_{n,j}/P'_{n,j})$ and $(\xi_{n,j}^2/\xi'_{n,j}^2)$ enter in only second or higher order. This property translates into a significant advantage. Also, the contributions to each component of the conjugated quadratures $|C_{n,p}|\cos \phi_{A_{n,p}C_{n,p}}$ and $|C_{n,p}|\sin \phi_{A_{n,p}C_{n,p}}$ for each of the orthogonally polarized beams from a respective set of eight electrical interference signal values have the same window function and thus are obtained as jointly determined values.

Other distinguishing features of the variant of the quad-homodyne detection method are evident in Equations (17), (19), (20), and (21): the coefficients of the conjugated quadratures $|A_{n,p}||C_{n,p}|\cos \phi_{A_{n,p}C_{n,p}}$ and $|A_{n,p}||C_{n,p}|\sin \phi_{A_{n,p}C_{n,p}}$ for each of the orthogonally polarized beams in respective equations of Equations (20) are identical independent of errors in assumed values for $\xi_{n,j}$ and $\eta_{n,j}$; and the coefficients of reference intensity terms $|A_{n,p}|^2$ can be made to be substantially zero by the selection of values for $\xi'_{n,j}$. Thus highly accurate values of the phases corresponding to conjugated quadratures can be measured with first order variations in $\xi_{n,j}$ and first order errors in normalizations such as $(P_{n,j}/P'_{n,j})$ and $(\xi_{n,j}^2/\xi'_{n,j}^2)$ entering in only through some high order effect.

It is also evident that since the conjugated quadratures of fields of orthogonally polarized beams are obtained jointly when using the variant of the quad-homodyne detection method, there is a significant reduction in the potential for an error in tracking phase as a result of a phase redundancy unlike the situation possible in traditional homodyne detection of conjugated quadratures of fields.

There are a number of advantages of the variant of the quad-homodyne detection method as a consequence of the conjugated quadratures of fields being jointly acquired quantities.

One advantage of the variant of the quad-homodyne detection method in relation to the variant of the bi-homodyne detection method is a factor of two increase in through-put.

Another advantage is a reduced sensitivity the effects of an overlay error of a spot in or on the substrate that is being imaged and a conjugate image of a pixel of a conjugate set of pixels of a multipixel detector during the acquisition of the eight electrical interference signal values of each spot in and/or on a substrate imaged using interferometric far-field and/or near-field confocal or non-confocal microscopy. Overlay errors are errors in the set of eight conjugate images of a respective set of conjugate detector pixels relative to the spot being imaged.

Another advantage is that when operating in the scanning mode there is a reduced sensitivity to effects of pinhole-to-pinhole variations in properties of a conjugate set of pinholes used in a confocal microscopy system that are conjugate to a spot in or on the substrate being imaged at different times during the scan.

Another advantage is that when operating in the scanning mode there is a reduced sensitivity to effects of pixel-to-pixel variation of properties within a set of conjugate pixels that are conjugate to a spot in or on the substrate being imaged at different times during the scan.

Another advantage is that when operating in the scanning mode there is reduced sensitivity to effects of pulse to pulse variations of a respective conjugate set of pulses of input beam 24 to the interferometer system.

The pinholes and pixels of a multipixel detector of a set of conjugate pinholes and conjugate pixels of a multipixel detector may comprise contiguous pinholes of an two arrays of pinholes and/or contiguous pixels of a multipixel detector or may comprise selected pinholes from two arrays of pinholes and pixels from arrays of pixels wherein the separation between selected pinholes is an integer number of pinhole spacings and the separation between an array of respective pixels corresponds to an integer number of pixel spacings without loss of lateral and/or longitudinal resolution and signal-to-noise ratios. The corresponding scan rate would be equal to the integer times the spacing of spots on the measurement object 60 conjugate to set of conjugate pinholes and/or set of conjugate pixels divided by the read out rate of the multipixel detector. This property permits a significant increase in through-put for an interferometric far-field or near-field confocal or non-confocal microscope with respect to the number of spots in and/or on a substrate imaged per unit time.

There is a variant of the single-homodyne detection method wherein a set of eight electrical interference signal values are obtained for each spot on and/or in substrate 60 being imaged with two pulse trains from source 18 and beam-conditioner 22. For the variant of the single-homodyne detection method, the interferometric signal values $S_{1,j}, S_{2,j}, S_{3,j}$, and $S_{4,j}$ are measured simultaneously by four different detector pixels for each pulse j. The distribution of the output beam 32 to four different pixels of detector 70 is achieved by a dispersion or polarizing elements in interferometer system 10 such as described in cited U.S. Provisional Patent Application Ser. No. 60/442,858 (47) and U.S. patent application Ser. No. 10/765,369, filed Jan. 27, 2004 (ZI-47) and entitled "Apparatus and Method for Joint Measurements of Conjugated Quadratures of Fields of Reflected/Scattered and Transmitted Beams by an Object in Interferometry."

The variant of the single-homodyne detection method is equivalent to the single-homodyne detection method being used to obtain and analyze interferometric signal values, e.g., $S_{1,j}$, $S_{2,j}$, $S_{3,j}$, and $S_{4,j}$. As a result of the equivalence of each of the four portions of the variant of the single-homodyne detection method with the single-homodyne detection method, the remaining formal portions of the description of the variant of the single-homodyne detection method is the same as the corresponding portion of the description for the single-homodyne detection method.

There is a variant of the double-homodyne detection method wherein a set of eight electrical interference signal values are obtained for each spot on and/or in substrate 60 being imaged with a single pulse train from source 18 and beam-conditioner 22. For the variant of the double-homodyne detection method, the interferometric signal values $S_{1,j}$, j=1,2, . . . 8, are measured simultaneously by eight different detector pixels for the single pulse. The distribution of the output beam 32 to four different pixels of detector 70 is achieved by a dispersion or polarizing elements in interferometer system 10 such as described in cited U.S. Provisional Patent Application Ser. No. 60/442,858 (ZI-47) and U.S. patent application Ser. No. 10/765,369, filed Jan. 27, 2004 (ZI-47) and entitled "Apparatus and Method for Joint Measurements of Conjugated Quadratures of Fields of Reflected/Scattered and Transmitted Beams by an Object in Interferometry."

The variant of the double-homodyne detection method is equivalent to the double-homodyne detection method being used to obtain and analyze the interferometric signal values, e.g., $S_{1,j}$, j=1,2, . . . 8. As a result of the equivalence of each of the eight portions of the variant of the double-homodyne detection method with the double-homodyne detection method, the remaining formal portions of the description of the variant of the double-homodyne detection method is the same as the corresponding portion of the description of the double-homodyne detection method.

Figure 2A:
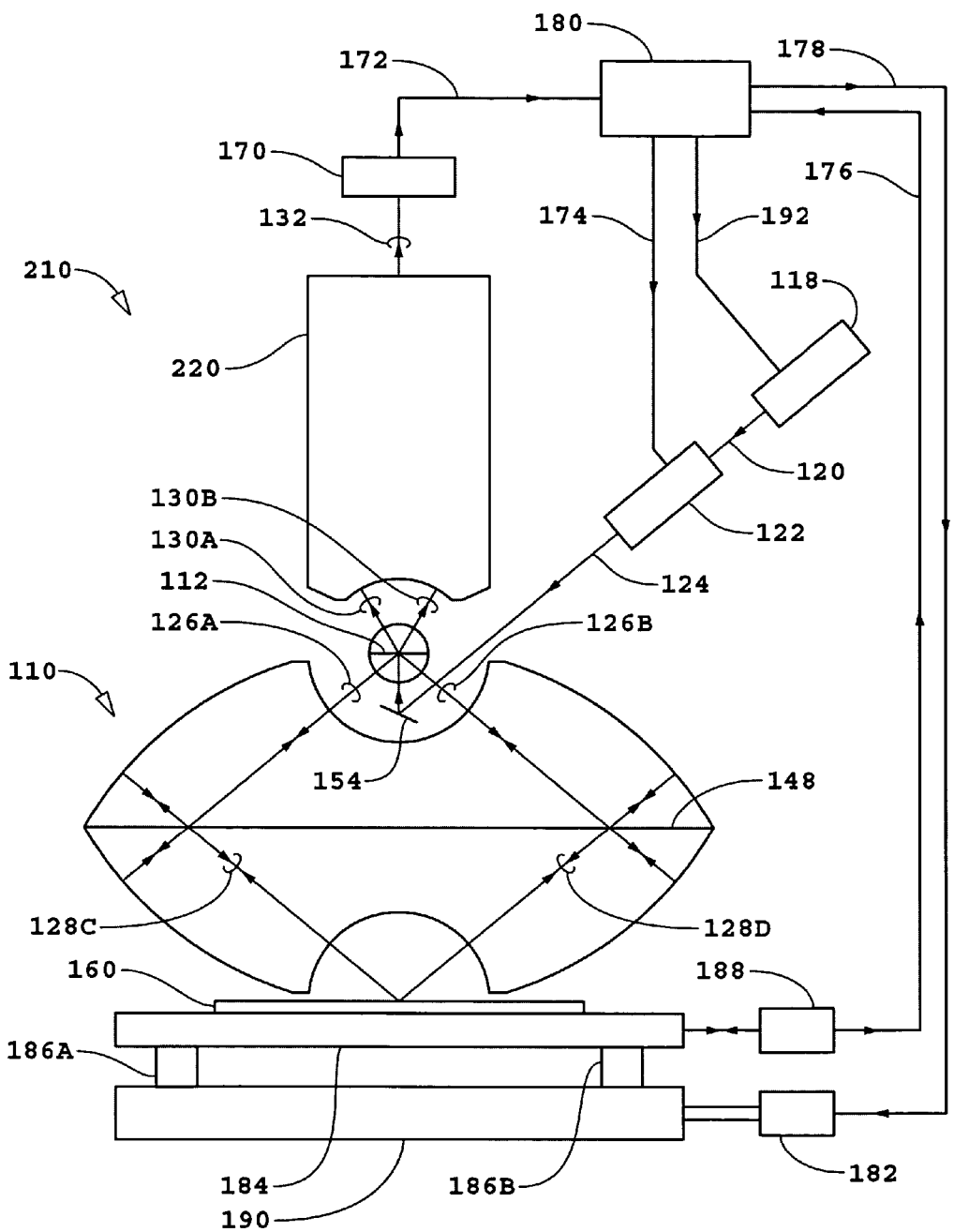
FIG. 2a is a schematic diagram of a confocal microscope system.

A first embodiment is shown schematically in FIG. 2a. The first embodiment comprises a first imaging system generally indicated as numeral 110, pinhole array beam-splitter 112, detector 170, and a second imaging system generally indicated as numeral 210. The second imaging system 210 is low power microscope having a large working distance, e.g. Nikon ELWD and SLWD objectives and OlympusLWD, ULWD, and ELWD objectives.

In the first embodiment, the difference in the optical path length of a reference beam and a measurement beam is a relatively large non-zero value, e.g. 0.2 m. The difference in the optical path length of the reference and measurement beams in interferometric measurements is normally kept a minimums value. However, in certain interferometric far-field confocal microscopes the difference in the optical path length of the reference and measurement beams is a relatively large value such as described in commonly owned U.S. Provisional Patent Application No. 60/442,982 (ZI-45) entitled "Interferometric Confocal Microscopy Incorporating Pinhole Array Beam-Splitter" and U.S. patent application Ser. No. 10/765,229, filed Jan. 27, 2004 (ZI-45) and also entitled "Interferometric Confocal Microscopy Incorporating Pinhole Array Beam-Splitter" both of which are by Henry A. Hill. The contents of both of the U.S. Provisional Patent Application and the U.S. Patent Application are incorporated herein in their entirety by reference.

Figure 2B:
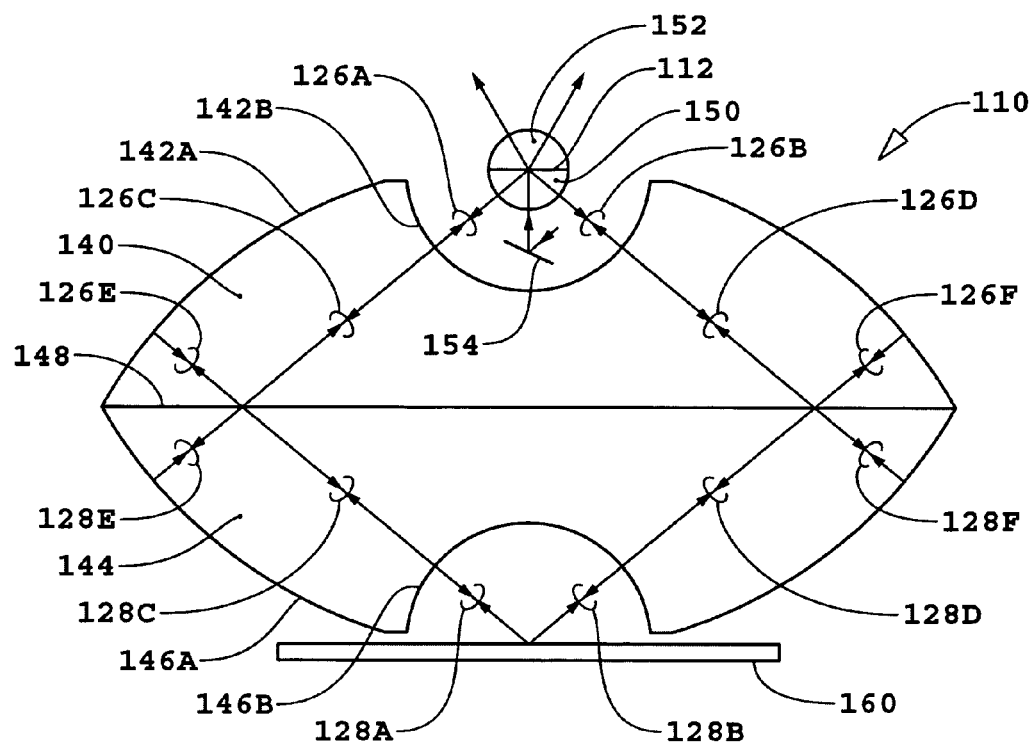
FIG. 2b is a schematic diagram of catadioptric imaging system.

The first imaging system 110 is shown schematically in FIG. 2b and comprises the interferometric confocal microscopy system described in cited U.S. Provisional Application No. 60/442,982 (ZI-45) and in cited U.S. patent application Ser. No. 10/765,229, filed Jan. 27, 2004 (ZI-45) entitled "Interferometric Confocal Microscopy Incorporating Pinhole Array Beam-Splitter." The imaging system 110 is a catadioptric system such as described in commonly owned U.S. Pat. No. 6,552,852 B1 (ZI-38) entitled "Catoptric and Catadioptric Imaging System" by Henry A. Hill and U.S. patent application Ser. No. 10/366,651 (ZI-43) entitled "Catoptric And Catadioptric Imaging Systems" by Henry A. Hill, the contents of the cited U.S. Patent and the U.S. Provisional Patent Application incorporated herein in their entirety by reference.

Catadioptric imaging system 110 comprises catadioptric elements 140 and 144, beam splitter 148, and convex lens 150. Surfaces 142A and 146A are convex spherical surfaces with nominally the same radii of curvature and the respective centers of curvature of surfaces 142A and 146A are conjugate points with respect to beam splitter 148. Surfaces 142B and 146B are concave spherical surfaces with nominally the same radii of curvature. The centers of curvature of surfaces 142B and 146B are the same as the centers of curvature of surfaces 146A and 142A, respectively. The center of curvature of convex lens 150 is the same as the center of curvature of surfaces 142B and 146A. The radius of curvature of surface 146B is selected so as to minimize the loss in efficiency of the imaging system 110 and to produce a working distance for imaging system 110 acceptable for an end use application. The radius of curvature of convex lens 150 is selected so that the off-axis aberrations of the catadioptric imaging system 110 are compensated. The medium of elements 140 and 144 may be for example $CaF_2$, fused silica or commercially available glass such as SF11. The medium of convex lens 150 may be for example $CaF_2$, fused silica, YAG, or commercially available glass such as SF11. An important consideration in the selection of the medium of elements 140 and 144 and convex lens 150 will the transmission properties for the frequencies of beam 124.

Figure 2C:
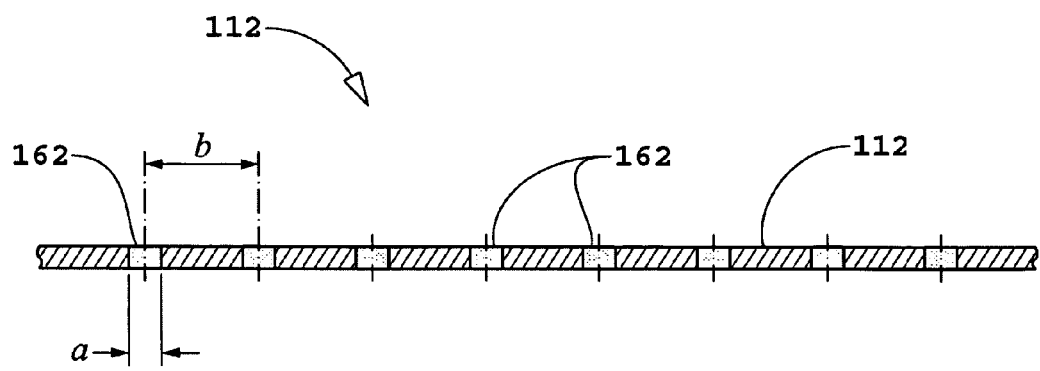
FIG. 2c is a schematic diagram of a pinhole array used in a confocal microscope system.

Convex lens 152 has a center of curvature the same as the center of curvature of convex lens 150. Convex lenses 150 and 152 are bonded together with pinhole beam-splitter 112 in between. Pinhole array beam-splitter 112 is shown in FIG. 2c. The pattern of pinholes in pinhole array beam-splitter is chosen to match the requirements of an end use application. An example of a pattern is a two dimensional array of equally spaced pinholes in two orthogonal directions. The pinholes may comprise circular apertures, rectangular apertures, or combinations thereof such as described in commonly owned U.S. patent application Ser. No. 09/917,402 (ZI-15) entitled "Multiple-Source Arrays for Confocal and Near-field Microscopy" by Henry A. Hill and Kyle Ferrio of which the contents thereof are included herein in their entirety by reference. The spacing between pinholes of pinhole array beam-splitter 112 is shown in FIG. 2c as b with aperture size a.

Input beam 124 is reflected by mirror 154 to pinhole beam-splitter 112 where a first portion thereof is transmitted as reference beam components of output beam 130A and 130B and a second portion thereof scattered as measurement beam components of beams 126A and 126B. The measurement beam components 126A and 126B are imaged as components of beams 128A and 128B to an array of image spots in an image plane close to substrate 160. A portion of the components of beams 128A and 128B incident on substrate 160 are reflected and/or scattered as return measurement beam components of beams 128A and 128B. Return measurement beam components of beams 128A and 128B are imaged by catadioptric imaging system 110 to spots that are coincident with the pinholes of pinhole beam-splitter 112 and a portion thereof is transmitted as return measurement beam components of output beams 130A and 130B.

The description of the imaging properties of the catadioptric imaging system 110 is the same as the corresponding portion of the description of the imaging properties of a catadioptric imaging system given in cited U.S. Provisional Application No. 60/442,982 (ZI-45) and in cited U.S. patent application Ser. No. 10/765,229, filed Jan. 27, 2004 (ZI-45) entitled "Interferometric Confocal Microscopy Incorporating Pinhole Array Beam-Splitter."

The next step is the imaging of output beams 130A and 130B by imaging system 210 to an array of spots that coincide with the pixels of a multipixel detector such as a CCD to generate an array of electrical interference signals 172. The array of electrical interference signals is transmitted to signal processor and controller 180 for subsequent processing.

The description of input beam 124 is the same as corresponding portions of the description given for input beam 24 of FIG. 1a with source 118 configured to generate two orthogonally polarized frequency components and beam conditioner 122 configured as the beam-conditioner 22 shown in FIGS. 1b and 1c. Input beam 124 comprises two components that have different frequencies and have the same state of plane polarization and a second set of two components that have different frequencies and have an orthogonal state of plane polarization. The frequency of each component of input beam 124 are shifted between different frequency values by beam conditioner 122 according to control signal 174 generated by electronic processor and controller 180.

The conjugated quadratures of fields of the return measurement beams are obtained using the variant of bi-homodyne detection as described in the description of FIGS. 1a–1c wherein sets of four measurements of the electrical interference signals 172 are made. For each of the set of four measurements of the electrical interference signals 172, a known sequence of phase shifts is introduced between the reference beam component and the return measurement beam component of output beams 130A and 130B.

The sequence of phase shifts is generated in the first embodiment by shifting the frequencies of components of input beam 124 by beam-conditioner 122. There is a difference in optical path length between the reference beam components and the return beam components of output beams 130A and 130B and as a consequence, a change in frequencies of components of input beam 124 will generate corresponding phase shifts between the reference beam components and the return beam components of output beams 130A and 130B. For an optical path difference L between the reference beam components and the return beam components of output beams 130A and 130B, there will be for a frequency shift $\Delta f$ a corresponding phase shift $\phi$ where $$\varphi = 2\pi L \left( \frac{\Delta f}{c} \right) \quad (29)$$

and c is the free space speed of light. Note that L is not a physical path length difference and depends for example on the average index of refraction of the measurement beam and the return measurement beam paths. For an example of a phase shift ($\phi=\pi/2$ and a value of L=0.25 m, the corresponding frequency shift $\Delta f$=300 MHz.

Two different modes are described for the acquisition of the electrical interference signals 172. The first mode to be described is a step and stare mode wherein substrate 160 is stepped between fixed locations corresponding to locations where image information is desired. The second mode is a scanning mode. In the step and stare mode for generating a one-dimensional, a two-dimensional or a three-dimensional profile of substrate 160, substrate 160 mounted in wafer chuck 184/stage 190 is translated by stage 190. The position of stage 190 is controlled by transducer 182 according to servo control signal 178 from electronic processor and controller 180. The position of stage 190 is measured by metrology system 188 and position information acquired by metrology system 188 is transmitted to electronic processor and controller 180 to generate an error signal for use in the position control of stage 190. Metrology system 188 may comprise for example linear displacement and angular displacement interferometers and cap gauges.

Electronic processor and controller 180 translates wafer stage 190 to a desired position and then acquires a set of four electrical interference signal values corresponding. After the acquisition of the sequence of four electrical interference signals, electronic processor and controller 180 then repeats the procedure for the next desired position of stage 190. The elevation and angular orientation of substrate 160 is controlled by transducers 186A and 186B.

The second mode for the acquisition of the electrical interference signal values is next described wherein the electrical interference signal values are obtained with the position of stage 190 scanned in one or more directions. In the scanning mode, source 118 is pulsed at times controlled by signal 192 from signal processor and controller 180. Source 118 is pulsed at times corresponding to the registration of the conjugate image of pinholes of pinhole array beam-splitter 112 with positions on and/or in substrate 160 for which image information is desired.

There will be a restriction on the duration or "pulse width" of a beam pulse $\tau_{p1}$ produced by source 120 as a result of the continuous scanning mode used in the third variant of the first embodiment. Pulse width $\tau_{p1}$ will be a parameter that in part controls the limiting value for spatial resolution in the direction of a scan to a lower bound of $$\tau_{p1} V, \quad (30)$$

where V is the scan speed. For example, with a value of $\tau_{p1}$=50 nsec and a scan speed of V=0.20 m/sec, the limiting value of the spatial resolution $\tau_{p1} V$ in the direction of scan will be $$\tau_{p1} V = 10 \text{ nm}. \quad (31)$$

Pulse width $\tau_{p1}$ will also determine the minimum frequency difference that can be used in the variant of the bi-homodyne detection method. In order that there be no contributions to the electrical interference signals from interference between fields of conjugated quadratures, the minimum frequency spacing $\Delta f_{min}$ is expressed as $$\Delta f_{\min} \gg \frac{1}{\tau_{pl}}. \tag{32}$$

For the example of $\tau_{p1}$=50 nsec, $1/\tau_{p1}$=20 MHz.

The frequencies of input beam 124 are controlled by signal 174 from signal processor and controller 180 to correspond to the frequencies that will yield the desired phase shifts between the reference and return measurement beam components of output beams 130A and 130B. In the first mode for the acquisition of the electrical interference signals 172, the set of eight electrical interference signals are generated by a common pixel of detector 170. In the second mode for the acquisition of electrical interference signals 172, each set of the two sets of four electrical interference signal values are not generated by a common pixel of detector 170. Thus in the second mode of acquisition, the differences in pixel efficiency and the differences in sizes of pinholes in pinhole array beam-splitter 112 are compensated in the signal processing by signal processor and controller 180 as described in the description of the variant of the bi-homodyne detection method given with respect to FIGS. 1a–1c. The joint measurements of conjugated quadratures of 8-fields of orthogonally polarized beams scattered/reflected by an object are generated by electric processor and controller 180 as previously described in the description of the variant of bi-homodyne detection.

A variant of the first embodiment is described that is configured for interferometric ellipsometric measurements. The variant of the first embodiment generates joint measurements of fields of orthogonally polarized beams scattered/reflected by an object. The variant of the first embodiment comprises the apparatus and method of the first embodiment except that pinhole array 112 is replaced with an array of microgratings, i.e., pinholes 162 of FIG. 2c are replaced by a micrograting such as shown schematically in FIG. 2d.

In ellipsometric measurements at large angle of incidence, the spatial resolution is generally many $\lambda$. Advantage of this is taken in the variant of the first embodiment by the replacement of a pinhole 162 with a micrograting (see FIG. 2d). The use of a micrograting increases the fraction of the input beam that is available for the measurement beam and increases the transmission efficiency of the return measurement beam through the array of microgratings.

Figure 2D:
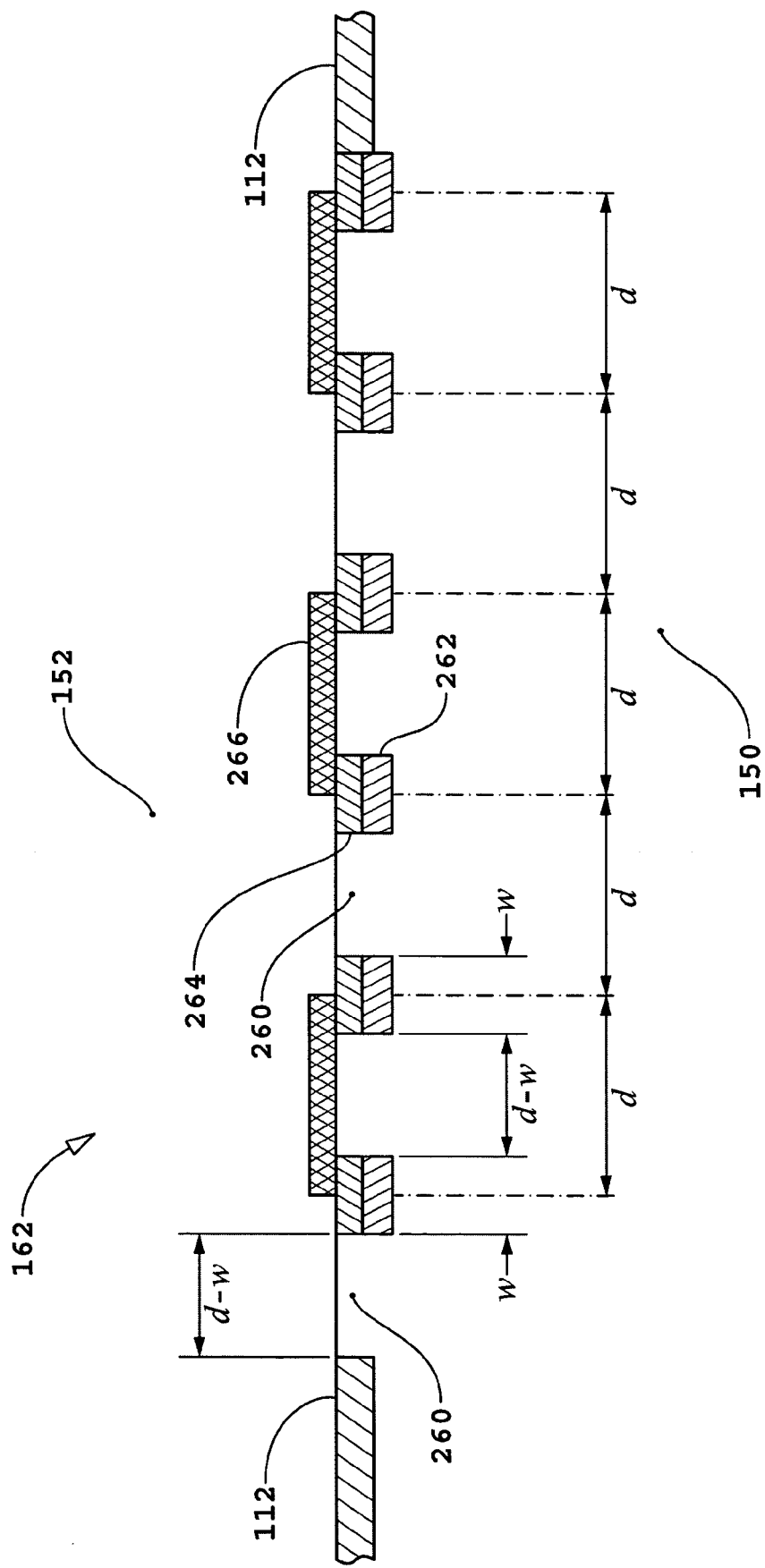
FIG. 2d is a schematic diagram of an array of microgratings used in a confocal microscope system.

In FIG. 2d, the micrograting comprises 6 transmitting apertures 260 and 6 reflecting stops 264. Superimposed on stops 264 are phase shifters 262. The optical thickness of phase shifters 262 is selected so that the m=0 order of the input beam reflected by the micrograting is nominally zero. The spacing d is selected so that the m=±1 orders of the input beam reflected by the micrograting corresponds to the angle of incidence desired in an ellipsometric measurement. This gives a high efficiency for the coupling of the input beam to the measurement beam for both orthogonal states of components of the input beam.

To reduce the numerical aperture of lens assembly 220, phase shifters 266 are added to the micrograting as shown in FIG. 2d. The effective thickness of phase shifters 266 is selected so that corresponding transmitted portions of return measurement beams are phase shifted by $\pi$. The net result is that the transmitted return measurement beam component are m=±1 orders with an effective angle of refraction of approximately ½ of the desired angle of incidence in the ellipsometric measurement.

The variant of the first embodiment may comprise a stop to restrict the plane of polarization of the measurement beam at substrate 60 to substantially a single value for each of the two polarization components of the input beam. The length of apertures 260 and reflecting elements 264 in a direction out of the plane of FIG. 2d can selected to optimize the coupling efficiency of the input beam to the desired measurement beam for ellipsometric measurements without degrading the overall spatial resolution. The stop may be placed for example at concave surface 142B (see FIG. 2b).

A second embodiment comprises the interferometer system of FIGS. 1a-1c with interferometer 10 comprising an interferometric near-field confocal microscope such as described in U.S. Pat. No. 6,4455,453 entitled "Scanning Interferometric Near-Field Confocal Microscopy" by Henry A. Hill, the contents of which are herein incorporated in their entirety by reference. .

A third embodiment and variant thereof uses the variant of the bi- and quad-homodyne detection methods, respectively, and comprises the interferometer system of FIGS. 1a–1c with interferometer 10 comprising an interferometric far-field confocal microscope such as described in cited U.S. Pat. No. 5,760,901. In the third embodiment and variant thereof, source 18 and beam-conditioner 22 are configured as a four-frequency generator and phase-shifter or an eight-frequency generator and phase-shifter, respectively. Embodiments in cited U.S. Pat. No. 5,760,901 are configured to operate in either the reflection or transmission mode. The third embodiment and variant thereof has reduced effects of background because of background reduction features of cited U.S. Pat. No. 5,760,901.

A fourth embodiment and variant thereof uses the variant of the bi- and quad-homodyne detection methods, respectively, and comprises the interferometer system of FIGS. 1a–1c with interferometer 10 comprising an interferometric far-field confocal microscope such as described in cited U.S. Pat. No. 5,760,901 wherein the phase masks are removed. In the fourth embodiment and variant thereof, source 18 and beam-conditioner 22 are configured as a four-frequency generator and phase-shifter or as an eight- frequency generator and phase-shifter, respectively. Embodiments in cited U.S. Pat. No. 5,760,901 are configured to operate in either the reflection or transmission mode. The fourth embodiment and variant thereof with the phase masks of embodiments of cited U.S. Pat. No. 5,760,901 removed represent applications of confocal techniques in a basic form.

A fifth embodiment and variant thereof uses the bi-or quad-homodyne detection methods, respectively, and comprises the interferometer system of FIGS. 1a–1c with interferometer 10 comprising an interferometric far-field confocal microscope such as described in cited U.S. Pat. No. 6,480,285 B1. In the fifth embodiment, source 18 and beam-conditioner 22 are configured as a four-frequency generator and phase-shifter or an eight-frequency generator and phase-shifter, respectively. Embodiments in cited U.S. Pat. No. 6,480,285 B1 are configured to operate in either the reflection or transmission mode. The fifth embodiment and variant thereof has reduced effects of background because of background reduction features of cited U.S. Pat. No. 6,480,285 B1.

A sixth embodiment and variant thereof uses the bi-or quad-homodyne detection method, respectively, and comprises the interferometer system of FIGS. 1a–1c with interferometer 10 comprising an interferometric far-field confocal microscope such as described in cited U.S. Pat. No. 6,480,285 B1 wherein the phase masks are removed. In the sixth embodiment and variant thereof, source 18 and beam-conditioner 22 are configured as a four-frequency generator and phase-shifter or an eight-frequency generator and phase-shifter, respectively. Embodiments in cited U.S. Pat. No. 6,480,285 B1 are configured to operate in either the reflection or transmission mode. The sixth embodiment and variant thereof with the phase masks of embodiments of cited U.S. Pat. No. 6,480,285 B1 removed represent applications of confocal techniques in a basic form.

A seventh embodiment and variant thereof uses the bi- or quad-homodyne detection method, respectively, comprises the interferometer system of FIGS. 1a–1c with interferometer 10 comprising an interferometric near-field confocal microscope such as described in cited U.S. Pat. No. 6,445,453 entitled "Scanning Interferometric Near-Field Confocal Microscopy" by Henry A. Hill, the contents of which are herein incorporated in their entirety by reference. In the tenth embodiment and variant thereof, source 18 and beam-conditioner 22 are configured as a four-frequency generator and phase-shifter or an eight-frequency generator and phase-shifter, respectively. Embodiments in cited U.S. Pat. No. 6,445,453 are configured to operate in either the reflection or transmission mode. The sixth embodiment of cited U.S. Pat. No. 6,445,453 in particular is configured to operate in the transmission mode with the measurement beam separated from the reference beam and incident on the substrate being imaged by a non-confocal imaging system, i.e., the measurement beam at the substrate is not an image of an array of pinholes but an extended spot. Accordingly, the corresponding embodiments of the sixth embodiment and variant thereof represent an application of bi- and quad-homodyne detection methods in non-confocal configurations for the measurement beam.

In other embodiments, interferometer 10 may comprise a interferometric apparatus such as described in U.S. Pat. No. 4,685,803 entitled "Method And Apparatus For The Measurement Of The Refractive Index Of A Gas" or U.S. Pat. No. 4,733,967 entitled "Apparatus Of The Measurement Of The Refractive Index Of A Gas" configured for use of the variants of either the bi- or quad-homodyne detection methods. The contents of both of the two cited U.S. Patents which are by Gary E. Sommargren are here within included in their entirety by reference. Embodiments which comprise interferometric apparatus such as described in the two cited U.S. patents represent configurations of a non-confocal type.

In other embodiments, interferometer 10 may comprise a Γ monitor such as described in U.S. Pat. No. 6,124,931 entitled "Apparatus And Methods For Measuring Intrinsic Optical Properties Of A Gas" by Henry A. Hill, the contents of which are here within incorporated in their entirety by reference. For the embodiments which comprise interferometric apparatus such as described in the cited U.S. patent, the described Γ monitor is configured for use of either the variant of the bi- or quad-homodyne detection method sand the embodiments represent configurations that are of a non-confocal type.

In yet other embodiments, interferometer 10 may comprise a wavelength monitor such as described in U.S. Patent Provisional Application No. 60/337,459 entitled "A Method For Compensation For Effects Of Non-Isotropic Gas Mixtures In Single-Wavelength And Multiple-Wavelength Dispersion Interferometry" by Henry A. Hill, the contents of which are here within incorporated in their entirety reference. For embodiments which comprise interferometric apparatus such as described in the cited U.S. patent, the wavelength monitor is configured for either the variant of the bi- or quad-homodyne detection method and the embodiments represent configurations that are of a non-confocal type.

Interferometer 10 may further comprise in other embodiments any type of interferometer, e.g., a differential plane mirror interferometer, a double-pass interferometer, a Michelson-type interferometer and/or a similar device such as is described in an article entitled "Differential Interferometer Arrangements For Distance And Angle Measurements: Principles, Advantages And Applications" by C. Zanoni, VDI Berichte Nr. 749, 93–106 (1989) configured for use of either the variant of the bi- or quad-homodyne detection methods. Interferometer 10 may also comprise a passive zero shear plane mirror interferometer as described in the commonly owned U.S. patent application Ser. No. 10/207,314 entitled "Passive Zero Shear Interferometers" or an interferometer with a dynamic beam steering element such as described in U.S. patent application with Ser. No. 09/852,369 entitled "Apparatus And Method For Interferometric Measurements Of Angular Orientation And Distance To A Plane Mirror Object" and U.S. Pat. No. 6,271,923 entitled "Interferometry System Having A Dynamic Beam Steering Assembly For Measuring Angle And Distance," all of which are by Henry A. Hill. For the in other embodiments of the present, the described interferometers are configured for use of either the variant of the bi- or quad-homodyne detection methods. The contents of the article by Zanoni and the three cited patents by Hill are included herein in their entirety by reference. The interferometer can be designed to monitor, for example, changes in optical path length, changes in physical path length, changes in wavelength of a beam, or changes in direction of propagation of a beam.

Interferometer 10 may further comprise a dispersion interferometer such as described in U.S. Pat. No. 6,219,144 B1 entitled "Apparatus and Method for Measuring the Refractive Index and Optical Path Length Effects of Air Using Multiple-Pass Interferometry" by Henry A. Hill, Peter de Groot, and Frank C. Demarest, and U.S. Pat. No. 6,407,816 entitled "Interferometer And Method For Measuring The Refractive Index And Optical Path Length Effects Of Air" by Peter de Groot, Henry A. Hill, and Frank C. Demarest, the contents of both of the cited patents are herein incorporated in their entirety by reference. For embodiments of the present application that comprise a dispersion interferometer, the described interferometers are configured for use of either the variant of the bi- or quad-homodyne detection method.

Other embodiments are within the following claims.

What is claimed is:

1. A method of making interferometric measurements of an object, the method comprising:

generating an input beam that includes a plurality of component beams, each of which is at a different frequency and all of which are spatially coextensive with each other, some of the components beams having a first polarization and the rest having a second polarization that is orthogonal to the first polarization;

deriving a plurality of measurement beams from the plurality of component beams, each of said plurality of measurement beams being at the frequency of the component beam from which it is derived;

focusing the plurality of measurement beams onto a selected spot to produce a plurality of return measurement beams;

combining each of the return measurement beams of the plurality of return measurement beams with a different corresponding reference beam of a plurality of reference beams to produce a plurality of interference beams; and acquiring a plurality of electrical interference signal values for the selected spot from the plurality of interference beams.

2. The method of claim 1, wherein acquiring the plurality of electrical interference signal values involves, for each of the plurality of acquired electrical signal values, introducing a different combination of phase shifts between the return measurement and reference beams that produce each of the interference beams of said plurality of interference beams.

3. The method of claim 1, wherein each of the plurality of electrical interference signal values contains information simultaneously about both fields of two orthogonally polarized beams coming from the selected spot.

4. The method of claim 1, wherein each of the plurality of electrical interference signal values contains information simultaneously about both conjugated quadratures of each field of the two orthogonally polarized beams scattered, reflected or transmitted by the object at the selected spot.

5. The method of claim 1, wherein the detector assembly includes a detector having a sensitivity that is characterized by a frequency bandwidth and further comprising using frequencies for the plurality of component beams that separated from each other by at least an amount that is greater than the frequency bandwidth of the detector.

6. The method of claim 1, wherein the plurality of component beams includes an equal number of beams at each of said first and second polarizations.

7. The method of claim 6, wherein the plurality of component beams includes two beams having the first polarization and two beams having the second polarization.

8. The method of claim 6, wherein the plurality of component beams equals four beams having the first polarization and four beams having the second polarization.

9. The method of claim 2, wherein introducing a different combination of phase shifts between the return measurement and reference beams that produce each of the interference beams of said plurality of interference beams involves introducing various frequency shifts into the frequencies of the beams of the plurality of component beams.

10. The method of claim 2, wherein the combining involves generating a plurality of interference beams that are coextensive in space and the method further involves focusing the plurality of interference beams onto a single detector element.

11. The method of claims 10, wherein acquiring said plurality of electrical interference signal values from the plurality of interference beams involves acquiring eight electrical interference signal values.

12. The method of claim 1 further comprising from the plurality of acquired electrical interference signal values computing information about fields of orthogonally polarized beams that are scattered, reflected, or transmitted by the object at the selected spot.

13. An interferometry system for making interferometric measurements of an object, said system comprising:

a beam generation module which during operation delivers an output beam that includes a first set of beams having a first polarization and a second set of beams having a second polarization that is orthogonal to the first polarization, wherein all of the beams of the first and second sets of beams are at a different frequency and within the output beam are coextensive in space, said beam generation module including a beam conditioner which during operation introduces a sequence of different shifts in a selected parameter of each of the beams of the first and second sets of beams, said selected parameter selected from a group consisting of phase and frequency;

a detector assembly; and an interferometer constructed to produce from the output beam a first set of measurement beams having the first polarization and a second set of measurement beams having the second polarization, said interferometer further constructed to image both the first and second sets of measurement beams onto a selected spot on the object to produce therefrom corresponding first and second sets of return measurement beams, and to combine the first and second sets of return measurement beams with a plurality of corresponding reference beams to produce a first and second set of interference beams and simultaneously image the first and second sets of interference beams onto the detector assembly.

14. The interferometry system of claim 13, wherein the measurement beams of the first and second sets of measurement beams are coextensive in space and share the same temporal window function.

15. The interferometry system of claim 13, wherein the beam conditioner by introducing the sequence of different shifts in the selected parameter of each of the beams introduces a different combination of phase shifts between the return measurement and reference beams that produce each of the interference beams of said plurality of interference beams.

16. The interferometry system of claim 13, wherein the detector assembly includes a detector element onto which the first and second sets of interference beams are simultaneously focused to generate an electrical interference signal value, wherein the electrical interference signal value contains information simultaneously about both fields of two orthogonally polarized beams coming from the selected spot.

17. The interferometry system of claim 16, wherein the electrical interference signal value contains information simultaneously about both conjugated quadratures of each field of the two orthogonally polarized beams scattered, reflected or transmitted by the object at the selected spot.

18. The interferometry system of claim 13, wherein the detector assembly includes a detector having a sensitivity that is characterized by a frequency bandwidth and wherein the frequencies of the beams of the first and second set of beams are separated from each other by at least an amount that is greater than the frequency bandwidth of the detector.

19. The interferometry system of claim 13, wherein the first and second sets of beams each includes two beams.

20. The interferometry system of claim 13, wherein the first and second sets of beams each includes four beams.

* * * * *